(12) United States Patent
Higeta et al.

(10) Patent No.: US 7,009,862 B2
(45) Date of Patent: Mar. 7, 2006

(54) SEMICONDUCTOR DEVICE

(75) Inventors: Keiichi Higeta, Hamura (JP); Satoshi Iwahashi, Ome (JP); Yoichiro Aihara, Ome (JP); Shigeru Nakahara, Musashimurayama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/011,427

(22) Filed: Dec. 15, 2004

(65) Prior Publication Data
US 2005/0146947 A1 Jul. 7, 2005

(30) Foreign Application Priority Data
Jan. 5, 2004 (JP) ............... 2004-000316

(51) Int. Cl.
*G11C 7/00* (2006.01)
(52) U.S. Cl. ......................... 365/49; 365/154
(58) Field of Classification Search .................. 365/49, 365/154, 189.11, 190
See application file for complete search history.

(56) References Cited

U.S. PATENT DOCUMENTS

| | | | |
|---|---|---|---|
| 4,646,271 A * | 2/1987 | Uchiyama et al. ............ | 365/49 |
| 4,780,845 A * | 10/1988 | Threewitt .................... | 365/49 |
| 5,490,102 A * | 2/1996 | Jubran ......................... | 365/49 |
| 5,495,382 A * | 2/1996 | Albon .......................... | 365/49 |
| 6,154,384 A | 11/2000 | Nataraj et al. ................ | 365/49 |
| 6,584,003 B1 * | 6/2003 | Kim et al. .................... | 365/49 |
| 2004/0012040 A1 | 1/2004 | Osada et al. ................. | 257/202 |
| 2004/0114411 A1 * | 6/2004 | Node et al. ................... | 365/49 |

FOREIGN PATENT DOCUMENTS

JP 2001-28401 1/2001

* cited by examiner

*Primary Examiner*—Vu A. Le
(74) *Attorney, Agent, or Firm*—Miles & Stockbridge P.C.

(57) ABSTRACT

Data lines (D0, D1) are shared by a first storage portion (MA) and a second storage portion (MB), and furthermore, a first transistor (MC0) coupled to a first comparison data portion (CD0) and a second transistor (MCA) coupled to the storage node of a first storage portion are connected in series to form a first comparing circuit (11), and a third transistor (MC1) coupled to a second comparison data line (CD1) and a fourth transistor (MCB) coupled to the storage node of the second storage portion are connected in series to form a second comparing circuit (12). Consequently, it is possible to enhance a symmetry in the layout of a diffusion layer and a wiring layer and to achieve the easiness of a layout in which a memory cell is line symmetrical with respect to a center line passing through a center thereof. Thus, a manufacturing process condition can easily be optimized and a variation in a manufacturing process can be reduced so that the microfabrication of the memory cell can be achieved.

19 Claims, 20 Drawing Sheets

FIG. 2

|  | WA | WB | D0 | D1 | MA | MB | CD0 | CD1 | MATCH |
|---|---|---|---|---|---|---|---|---|---|
| WRITE | H | H | L | H | 0 | 0 | L | L | Z |
|  | H | H | H | L | 1 | 1 | L | L | Z |
|  | H | L | L | H | 0 | M | L | L | Z |
|  | H | L | H | L | 1 | M | L | L | Z |
|  | L | H | L | H | M | 0 | L | L | Z |
|  | L | H | H | L | M | 1 | L | L | Z |
| READ | H | L | L | H | 0 | – | L | L | Z |
|  | H | L | H | L | 1 | – | L | L | Z |
|  | L | H | L | H | – | 0 | L | L | Z |
|  | L | H | H | L | – | 1 | L | L | Z |
| COMPARE | L | L | H | H | 0 | 0 | H | L | Z |
|  | L | L | H | H | 0 | 1 | H | L | Z |
|  | L | L | H | H | 1 | 0 | H | L | L |
|  | L | L | H | H | 1 | 1 | H | L | L |
|  | L | L | H | H | 0 | 0 | L | H | Z |
|  | L | L | H | H | 0 | 1 | L | H | L |
|  | L | L | H | H | 1 | 0 | L | H | Z |
|  | L | L | H | H | 1 | 1 | L | H | L |
| INACTIVE | L | L | L | L | M | M | L | L | Z |

FIG. 7

|  | WA | WB | D | MA | MB | CD0 | CD1 | MATCH |
|---|---|---|---|---|---|---|---|---|
| WRITE | H | H | L | 0 | 0 | L | L | Z |
|  | H | H | H | 1 | 1 | L | L | Z |
|  | H | L | L | 0 | M | L | L | Z |
|  | H | L | H | 1 | M | L | L | Z |
|  | L | H | L | M | 0 | L | L | Z |
|  | L | H | H | M | 1 | L | L | Z |
| READ | H | L | L | 0 | – | L | L | Z |
|  | H | L | H | 1 | – | L | L | Z |
|  | L | H | L | – | 0 | L | L | Z |
|  | L | H | H | – | 1 | L | L | Z |
| COMPARE | L | L | H | 0 | 0 | H | L | Z |
|  | L | L | H | 0 | 1 | H | L | Z |
|  | L | L | H | 1 | 0 | H | L | L |
|  | L | L | H | 1 | 1 | H | L | L |
|  | L | L | H | 0 | 0 | L | H | Z |
|  | L | L | H | 0 | 1 | L | H | L |
|  | L | L | H | 1 | 0 | L | H | Z |
|  | L | L | H | 1 | 1 | L | H | L |
| INACTIVE | L | L | L | M | M | L | L | Z |

FIG. 10

| | WA | WB | D0 | D1 | MA | MB | CD0A | CD1A | CD0B | CD1B | MATCH |
|---|---|---|---|---|---|---|---|---|---|---|---|
| MA WRITE | H | L | L | H | 0 | M | L | L | L | L | Z |
| | H | L | H | L | 1 | M | L | L | L | L | Z |
| MB WRITE | L | H | L | H | M | 0 | L | L | L | L | Z |
| | L | H | H | L | M | 1 | L | L | L | L | Z |
| MA READ | H | L | L | H | 0 | – | L | L | L | L | Z |
| | H | L | H | L | 1 | – | L | L | L | L | Z |
| MB READ | L | H | L | H | – | 0 | L | L | L | L | Z |
| | L | H | H | L | – | 1 | L | L | L | L | Z |
| COMPARE | – | – | – | – | 0 | 0 | H | L | H | L | Z |
| | – | – | – | – | 0 | 1 | H | L | H | L | L |
| | – | – | – | – | 1 | 0 | H | L | H | L | L |
| | – | – | – | – | 1 | 1 | H | L | H | L | L |
| | – | – | – | – | 0 | 0 | L | H | L | H | L |
| | – | – | – | – | 0 | 1 | L | H | L | H | L |
| | – | – | – | – | 1 | 0 | L | H | L | H | L |
| | – | – | – | – | 1 | 1 | L | H | L | H | Z |
| | – | – | – | – | 0 | 0 | H | L | L | H | L |
| | – | – | – | – | 0 | 1 | H | L | L | H | Z |
| | – | – | – | – | 1 | 0 | H | L | L | H | L |
| | – | – | – | – | 1 | 1 | H | L | L | H | L |
| | – | – | – | – | 0 | 0 | L | H | H | L | L |
| | – | – | – | – | 0 | 1 | L | H | H | L | L |
| | – | – | – | – | 1 | 0 | L | H | H | L | Z |
| | – | – | – | – | 1 | 1 | L | H | H | L | L |
| INACTIVE | L | L | L | L | M | M | L | L | L | L | Z |

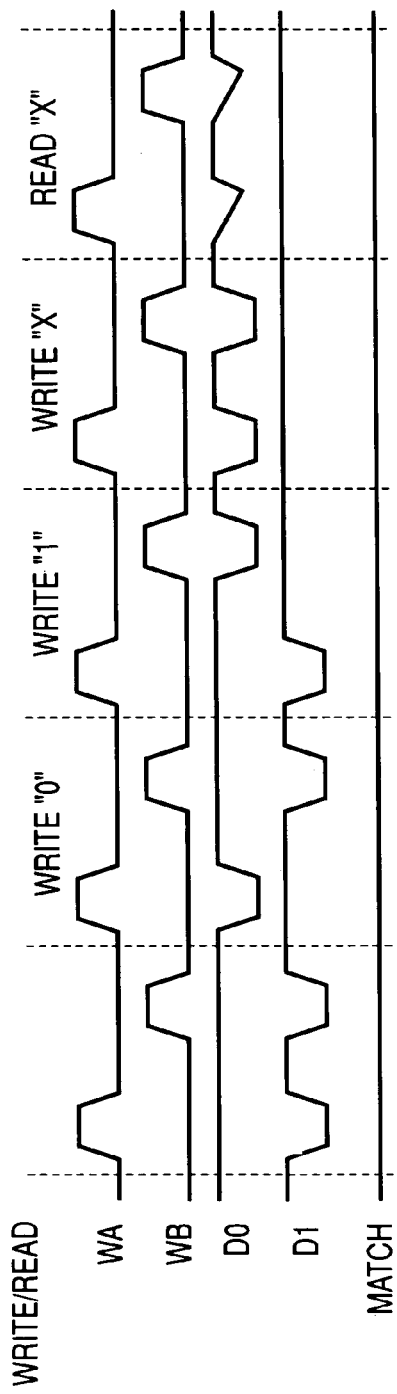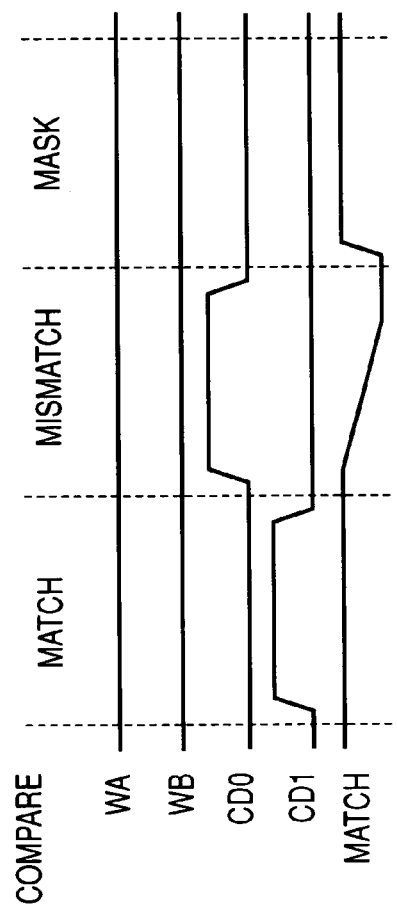

SEMICONDUCTOR DEVICE

CLAIM OF PRIORITY

The present application claims priority from Japanese application JP2004-000316 filed on Jan. 5, 2004, the content of which is hereby incorporated by reference into this application.

FIELD OF THE INVENTION

The present invention relates to a semiconductor device including a content addressable memory (hereinafter referred to as a "CAM") and more particularly to a layout technique therein, for example, an effective technique which is applied to an LSI for a router.

BACKGROUND OF THE INVENTION

With the development of the microfabrication of a semiconductor integrated circuit, the exposure light wavelength of a photolithography equipment has been shortened from a g-line to an i-line, and furthermore, an excimer laser. However, a requirement for the microfabrication has been given earlier than a progress in a reduction in the wavelength of the equipment, and in recent years, it has been necessary to reduce a pattern dimension to be equal to or smaller than a wavelength. When the pattern dimension is equal to or smaller than the wavelength, a pattern cannot be formed faithfully to a layout in a complicated pattern which is connected like a key, causing the symmetry of a memory cell to be broken. However, it has conventionally been necessary to bend the shape of a diffusion layer like a key in order to cause a p-well region to come in contact with a substrate. Consequently, the symmetry has been deteriorated, resulting in a hindrance to the microfabrication. In order to eliminate the drawback, there has been known a technique in which a p-well region having an inverter constituting an SRAM formed therein is divided into two portions, the portions are provided on both ends of an n-well region, a diffusion layer forming a transistor is not bent, and the direction of an arrangement is set to be parallel with a well region or a bit line so that the diffusion layer is prevented from taking a complicated shape, resulting in easy microfabrication (see JP-A-2001-28401 Publication (FIG. 1), for example).

Moreover, a CAM has been known as a memory to be used in an LSI for a router which carries out the relay of a packet and the selection of a route between different network addresses in the Internet communication network. As an example of such a CAM, there has been known a memory of a ternary type in which the 2-bit information of a data comparison mask is stored in a memory cell and the result of a comparison with input data is output to a match line (see U.S. Pat. No. 6,154,384 specification, for example).

SUMMARY OF THE INVENTION

The inventors of the application investigated a CAM and found various problems as will be described below.

In order to reduce the manufacturing cost of the CAM, it is necessary to improve the yield of the CAM. Moreover, it is possible to enhance the performance of an LSI by mounting a large number of CAMs on the same chip. For this purpose, however, it is necessary to reduce the area of a memory cell in the CAM. In order to improve the consumed power or operating speed of the CAM, it is effective to form the CAM to be small, thereby reducing a wiring length in the CAM as greatly as possible. In order to enhance the reliability of data read from the CAM, it is necessary to reduce the noise of a reading data line.

However, the patent document 1 has described the layout of an SRAM cell formed by six MOS transistors and has not described an optimum circuit for the CAM and a layout thereof. According to the patent document 2, furthermore, it can be supposed that a symmetrical layout having a small variation in a process is acquired in a small area with difficulty because a memory cell circuit includes a portion having no symmetry.

It is an object of the invention to provide a technique for decreasing a memory cell area in a CAM.

It is another object of the invention to provide a technique for reducing the noise of a match line in a CAM.

It is a further object of the invention to provide a technique for reducing the noise of a data reading data line in a CAM.

The above and other objects and novel features of the invention will be apparent from the description of this specification and the accompanying drawings.

In the application, the summary of the typical disclosed invention will be briefly descried as follows.

More specifically, when a semiconductor storage device is to be constituted to include a word line, a data line provided to cross the word line, a memory cell provided in a crossing portion of the word line and the data line, a data line for fetching comparing data, and a comparison match line for obtaining a result of a comparison of the comparing data transmitted through the comparison data line with data stored in the memory cell, the memory cell includes a first storage portion, a second storage portion provided separately therefrom, and comparing means capable of comparing the comparing data transmitted through the comparison data line with data stored in the first storage portion and the second storage portion, the data line is shared by the first storage portion and the second storage portion, the comparison data line includes a first comparison data line and a second comparison data line, and the comparing means includes a first comparing circuit constituted by connecting a first transistor coupled to the first comparison data line and a second transistor coupled to a storage node of the first storage portion in series, and a second comparing circuit constituted by connecting a third transistor coupled to the second comparison data line and a fourth transistor coupled to a storage node of the second storage portion in series.

According to the means, the data line is shared by the first storage portion and the second storage portion, and furthermore, the first transistor coupled to the first comparison data line is connected to the second transistor coupled to the storage node of the first storage portion in series to form the first comparing circuit, and the third transistor coupled to the second comparison data line is connected to the fourth transistor coupled to the storage node of the second storage portion in series to form the second comparing circuit. Consequently, it is possible to enhance a symmetry in the layout of a diffusion layer and a wiring layer and to achieve the easiness of a layout in which a memory cell is line symmetrical with respect to a center line passing through a center thereof. The memory cell is caused to have such a layout that it is line symmetrical with respect to a center line passing through a center thereof. Consequently, a manufacturing process condition can easily be optimized. Thus, a variation in a manufacturing process can be reduced and the microfabrication of a memory cell can be carried out, and furthermore, a semiconductor chip area can be decreased and the number of acquired chips and a yield can be improved so that a reduction in a manufacturing cost can be achieved.

In this case, it is possible to constitute the word line including a first word line provided corresponding to the first storage portion and a second word line provided corresponding to the second storage portion.

Moreover, it is possible to obtain such a layout as to include a plurality of transistors which is provided with gate electrodes aligned in an identical direction to each other and to be line symmetrical about a direction of formation of a gate.

A gate electrode of the second transistor and a gate electrode coupled to the second transistor in the first storage portion are shared, and a gate electrode of the fourth transistor and a gate electrode coupled to the fourth transistor in the second storage portion are shared. Consequently, an extra contact or electrode is not required.

By connecting the first comparing circuit and the second comparing circuit to the match line in common through a common contact hole, it is possible to achieve a reduction in the number of contacts.

It is possible to constitute the memory cell which includes a first storage portion having a pair of storage nodes on a complementary level, a second storage portion provided separately therefrom and having a pair of storage nodes on the complementary level, and comparing means capable of comparing the comparing data transmitted through the comparison data line with data stored in the first storage portion and the second storage portion, the data line which is shared by the first storage portion and the second storage portion, the comparison data line which includes a first comparison data line, a second comparison data line, a third comparison data line and a fourth comparison data line, and the comparing means which includes a first comparing circuit constituted by connecting a fifth transistor coupled to the first comparison data line and a sixth transistor coupled to one of the storage nodes in the first storage portion in series, a second comparing circuit constituted by connecting a seventh transistor coupled to the other storage node in the first storage portion and an eighth transistor coupled to the second comparison data line in series, a third comparing circuit constituted by connecting a ninth transistor coupled to the third comparison data line and a tenth transistor coupled to one of the storage nodes in the second storage portion in series, and a fourth comparing circuit constituted by connecting an eleventh transistor coupled to the other storage node in the second storage portion and a twelfth transistor coupled to the fourth comparison data line in series.

Also in such a structure, in order to achieve a reduction in the number of contacts, it is preferable that a gate electrode of the sixth transistor and a gate electrode coupled to the sixth transistor in the first storage portion should be shared, a gate electrode of the seventh transistor and a gate electrode coupled to the seventh transistor in the first storage portion should be shared, a gate electrode of the tenth transistor and a gate electrode coupled to the tenth transistor in the second storage portion should be shared, and a gate electrode of the eleventh transistor and a gate electrode coupled to the eleventh transistor in the second storage portion should be shared.

In order to reduce the number of contact holes, moreover, it is preferable that the first comparing circuit and the third comparing circuit should be connected to the match line in common through a common contact hole, and the second comparing circuit and the fourth comparing circuit should be connected to the match line in common through a common contact hole.

The data line and the comparing data line are formed by the same wiring layer and a power wiring is provided between the data line and the comparing data line. By causing the power wiring to exhibit a shielding function, it is possible to achieve a reduction in a noise in the data line.

BRIEF DESCRIPTION OF THE DRAWINGS

FIG. 2 is a truth table for the memory cell, FIG. 7 is a truth table for the memory cell shown in FIG. 6, FIG. 10 is a truth table for the memory cell shown in FIG. 9, FIG. 15A is a timing chart showing a write/read operation in the memory cell, FIG. 15B is a timing chart showing a comparing operation in the memory cell.

DETAILED DESCRIPTION OF THE PREFERRED EMBODIMENTS

Figure 20:
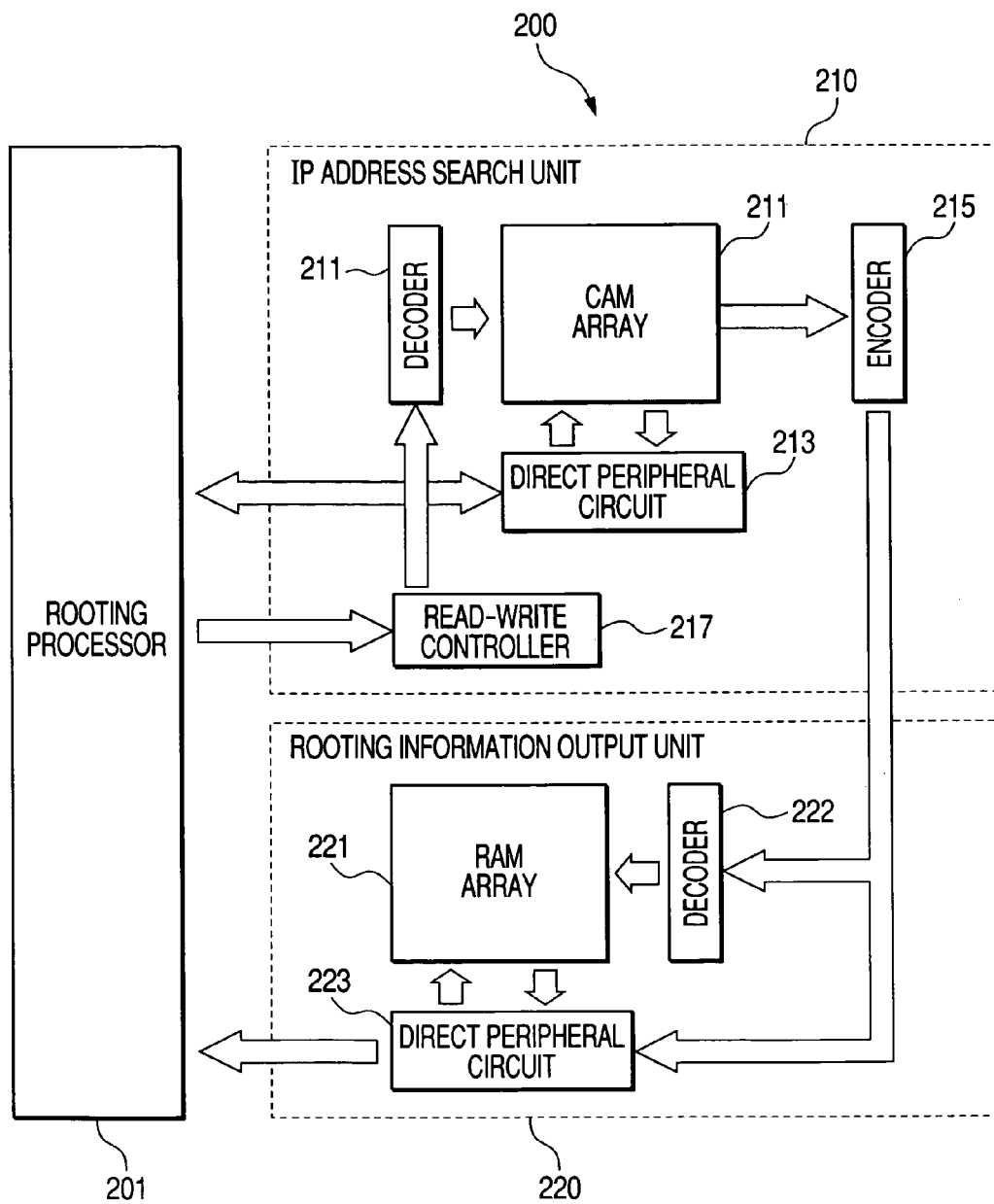
FIG. 20 is a block diagram showing an example of the structure of an LSI for a router which includes the CAM array.

FIG. 20 shows an LSI for a router according to an example of a semiconductor device in accordance with the invention. An LSI 200 for a router comprises a routing processor 201 for carrying out a transfer processing for a packet in accordance with destination address information included in packet data according to a predetermined program, an IP address search unit 210 for searching IP address information corresponding to a destination address transmitted from the routing processor 201 by using a routing table, and a routing information output portion 220 for outputting routing information corresponding to the IP address information searched by the IP address search unit 210, and is formed on one semiconductor substrate such as a monocrystalline silicon substrate by a well-known semiconductor integrated circuit manufacturing technique. The routing processor 201 carries out a transfer processing for packet data in accordance with the routing information transmitted from the routing information output portion 220. The IP address search unit 210 is not particularly restricted but includes a CAM array 211 having a plurality of CAMs arranged in an array, a decoder 212 for decoding the input address information, a peripheral circuit 213 for inputting/outputting data to/from the CAM array 211, an encoder 215 for encoding the data output from the CAM array 211, and a read/write controller 217 for carrying out a read/write control for the CAM array 211. The routing information output portion 220 is not particularly restricted but includes an RAM array 221 which stores routing information in relation to an IP address, a decoder 222 for decoding the result of a search obtained by the IP address search unit 210, and a peripheral circuit 223 for inputting/outputting data to/from the RAM array 221. Corresponding routing information is read from the RAM array 221 based on the result of the decoding obtained by the decoder 222 and is transmitted to the routing processor 201 through the peripheral circuit 223.

Figure 16:
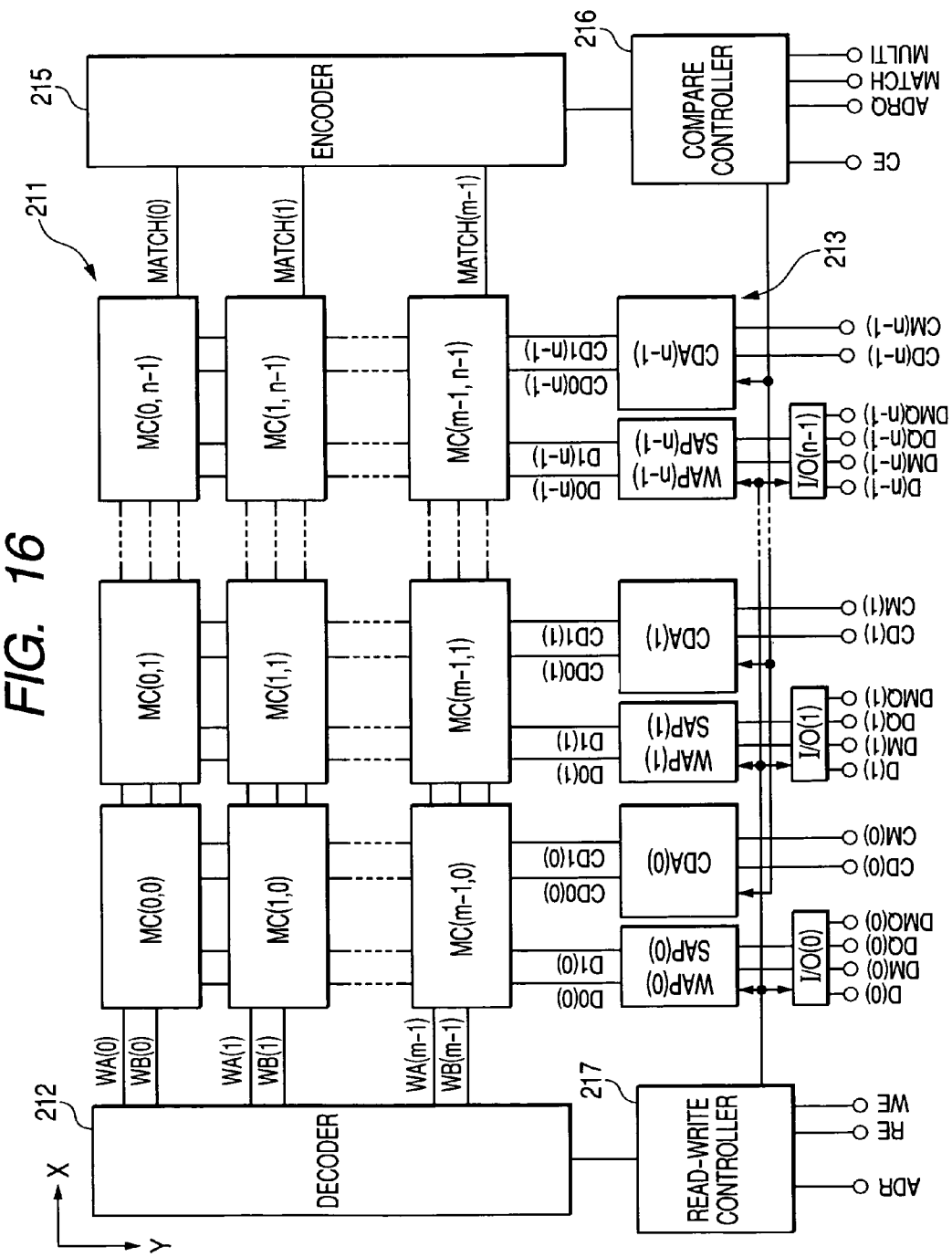
FIG. 16 is a block diagram showing an example of the structure of a CAM array including the memory cell illustrated in FIG. 1.

FIG. 16 shows an example of the structures of the CAM array 211 and the peripheral circuit 213.

The CAM array 211 is not particularly restricted but has plural sets of word lines WA(0), WB(0), WA(1), WB(1) to WA(m−1), and WB(m−1), and bit lines D0(0), D1(0), D0(1), D1(1), D0(n−1) and D1(n−1) and comparison lines CD0(0), CD1(0),CD0(1),CD1(1), CD0(n−1) and CD1(n−1) which are arranged to cross the word lines, and corresponding memory cells MC(0, 0) to MC(0, n−1), MC(1, 0) to MC(1, n−1), and MC(m−1, 0) to MC(m−1, n−1) are provided in their crossing portions, respectively. Moreover, a match line MATCH(0) is connected to the memory cells MC(0, 0) to MC(0, n−1) in common, a match line MATCH(1) is connected to the memory cells MC(1, 0) to MC(1, n−1) in common, and a match line MATCH(m−1) is connected to the memory cells MC(m−1, 0) to MC(m−1, n−1) in common. Furthermore, the match lines MATCH(0), MATCH(1) and MATCH(m−1) are connected to the encoder 215.

The peripheral circuit 213 is not particularly restricted but includes write amplifiers WAP(0) and WAP(1) to WAP (n−1), sense amplifiers SAP(0) and SAP(1) to SAP(n−1), comparison data amplifiers CDA(0) and CDA(1) to CDA (n−1), and input/output circuits I/O(0) and I/O(1) to I/O (n−1) capable of inputting/outputting a signal to/from an outside. The input/output circuit I/O(0) can selectively fetch data D(0) and DM(0) into an inside, and furthermore, can selectively output data DQ(0) and DMQ(0) to an outside. The input/output circuit I/O(1) can selectively fetch data D(1) and DM(1) into an inside, and furthermore, can selectively output data DQ(1) and DMQ(1) to an outside. The input/output circuit I/O(n−1) can selectively fetch data D(n−1) and DM(n−1) into an inside, and furthermore, can selectively output data DQ(n−1) and DMQ(n−1) to an outside. The comparison data amplifier CDA(0) controls the comparison data lines CD0(0) and CD1(0) in response to a comparison data input signal CD(0) and a comparison mask signal CM(0)by the control of a compare controller 216. The comparison data amplifier CDA(1) controls the comparison data lines CD0(1) and CD1(1) in response to a comparison data input signal CD(1) and a comparison mask signal CM(1) by the control of the compare controller 216. The comparison data amplifier CDA(n−1) controls the comparison data lines CD0(n−1) and CD1(n−1) in response to a comparison data input signal CD(n−1) and a comparison mask signal CM(n−1) by the control of the compare controller 216.

The compare controller 216 is selectively brought into an enable state in response to a comparison enable signal CE, and outputs an address signal ADRQ for reading routing information from the RAM array 221, a match signal MATCH for carrying out a control, and a multiple match signal MULTI. The read/write controller 217 inputs an address signal ADR, a read enable signal RE indicative of the validity of read, and a write enable signal WE indicative of the validity of write. The address signal ADR is decoded by the decoder 212, thereby generating a signal for driving, into a selection level, the word lines WA(0), WB(0), WA(1), WB(1) to WA(m−1), and WB(m−1).

Figure 1:
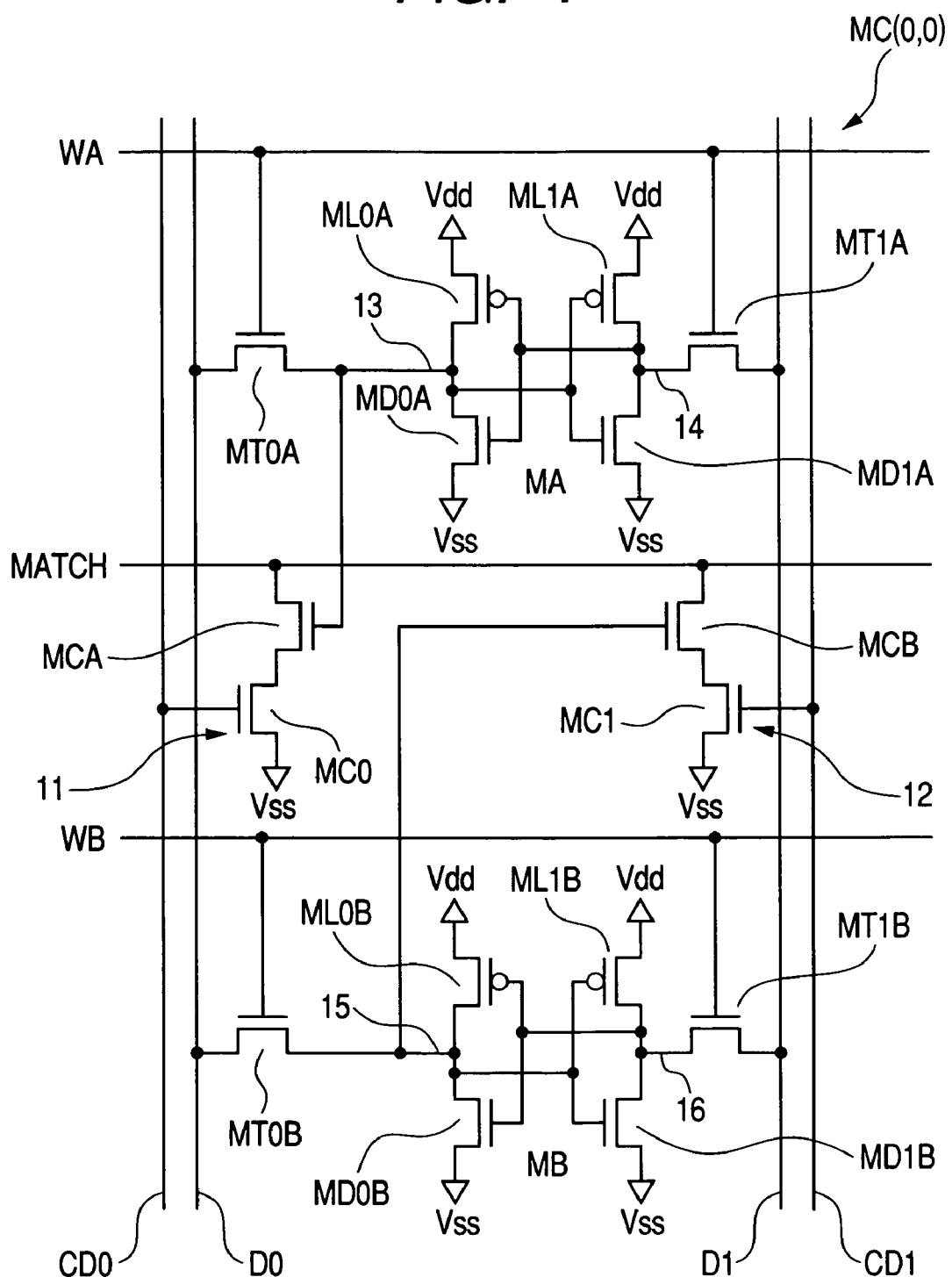
FIG. 1 is a circuit diagram showing an example of the structure of a memory cell in a CAM included in a semiconductor device according to the invention.

FIG. 1 typically shows an example of the structure of the memory cell MC(0, 0) to be one of a plurality of memory cells in the CAM array 211. The other memory cells have the same structures as the structure of the memory cell MC(0, 0).

The memory cell MC(0, 0) is referred to as a ternary type, and a first word line WA, a second word line WB and a match line MATCH are provided to cross a first data line D0, a second data line D1, a first comparison data line CD0 and a second comparison data line CD1, and a first storage portion MA, a second storage portion MB, a first comparing circuit 11 and a second comparing circuit 12 are provided in their crossing parts.

The first storage portion MA is constituted by connecting, like a loop, a first inverter obtained by connecting a p-channel type MOS transistor ML0A and an n-channel type MOS transistor MD0A in series and a second inverter obtained by connecting a p-channel type MOS transistor ML1A and an n-channel type MOS transistor MD1A in series. The source electrodes of the p-channel type MOS transistor ML0A and ML1A are coupled to a high potential side power supply Vdd, and the source electrodes of the n-channel type MOS transistors MD0A and MD1A are coupled to a low potential side power supply Vss. The first storage portion MA has a first storage node 13 and a second storage node 14. The first storage node 13 is coupled to the first data line D0 through an n-channel type MOS transistor MT0A to be a transfer MOS, and the second storage node 14 is coupled to the second data line D1 through an n-channel type MOS transistor MT1A to be the transfer MOS. The gate electrodes of the n-channel type MOS transistors MT0A and MT1A are coupled to the first word line WA. When the first word line WA is driven to a high level, the n-channel type MOS transistors MT0A and MT1A are conducted so that data can be read from the first storage portion MA and data can be written to the first storage portion MA.

The second storage portion MB is constituted by connecting, like a loop, a first inverter obtained by connecting a p-channel type MOS transistor ML0B and an n-channel type MOS transistor MD0B in series and a second inverter obtained by connecting a p-channel type MOS transistor ML1B and an n-channel type MOS transistor MD1B in series. The source electrodes of the p-channel type MOS transistor ML0B and ML1B are coupled to a high potential side power supply vdd, and the source electrodes of the n-channel type MOS transistors MD0B and MD1B are coupled to a low potential side power supply Vss. The second storage portion MB has a first storage node 15 and a second storage node 16. The first storage node 15 is coupled to the first data line D0 through an n-channel type MOS transistor MT0B to be a transfer MOS, and the second storage node 16 is coupled to the second data line D1 through an n-channel type MOS transistor MT1B to be the transfer MOS. The gate electrodes of the n-channel type MOS transistors MT0B and MT1B are coupled to the second word line WB. When the second word line WB is driven to a high level, the n-channel type MOS transistors MT0B and MT1B are conducted so that data can be read from the second storage portion MB and data can be written to the second storage portion MB.

The first comparing circuit 11 is constituted by connecting two n-channel type MOS transistors MCA and MC0 in series. The drain electrode of the n-channel type MOS transistor MCA is coupled to the match line MATCH, and the gate electrode of the n-channel type MOS transistor MCA is coupled to the first storage node 13 of the first storage portion MA. The source electrode of the n-channel type MOS transistor MC0 is coupled to a low potential side power supply Vss, and the gate electrode of the n-channel type MOS transistor MC0 is coupled to the first comparison data line CD0.

The second comparing circuit 12 is constituted by connecting two n-channel type MOS transistors MCB and MC1 in series. The drain electrode of the n-channel type MOS transistor MCB is coupled to the match line MATCH, and the gate electrode of the n-channel type MOS transistor MCB is coupled to the first storage node 15 of the second storage portion MB. The source electrode of the n-channel type MOS transistor MC1 is coupled to a low potential side power supply Vss, and the gate electrode of the n-channel type MOS transistor MC1 is coupled to the second comparison data line CD1.

Figure 18:
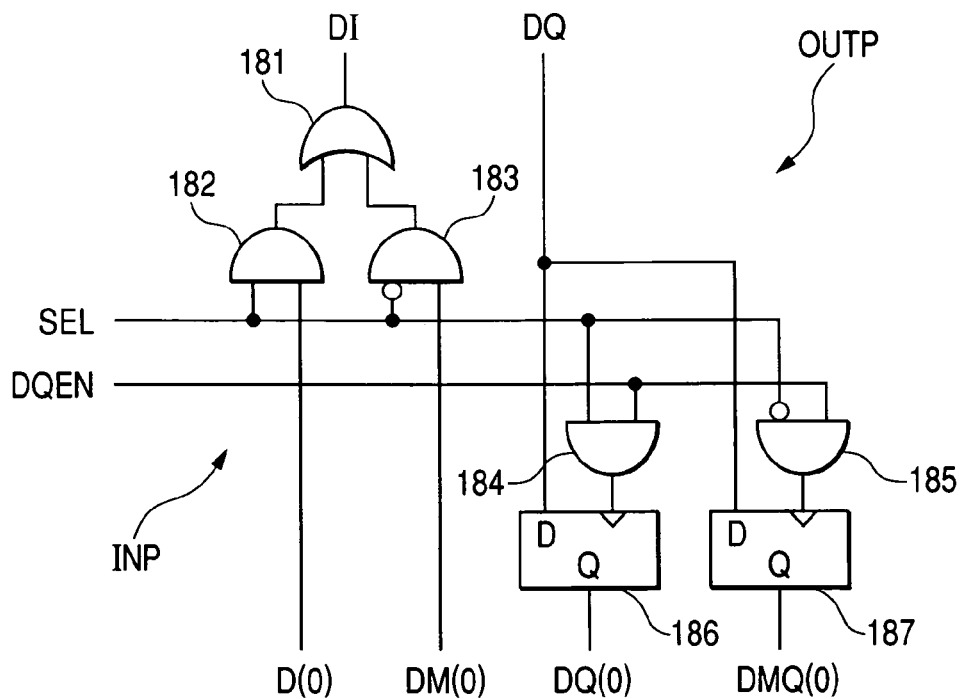
FIG. 18 is a circuit diagram showing an example of the structure of a main part in FIG. 16.

FIG. 18 shows an example of the structure of the input/output circuit I/O(0). Input/output circuits I/O(1) to I/O(n−1) have the same structures as the structure of the input/output circuit I/O(0).

The input/output circuit I/O(0) includes an input portion INP for fetching data to an inside and an output portion OUTP for outputting data to an outside. The input portion INP includes a 2-input AND gate 182 activated in response to a selecting signal SEL, a 2-input AND gate 183 activated in response to the logic inversion signal of the selecting signal SEL, and an OR gate 181 for obtaining the OR logic of the output signal of the AND gate 182 and the output signal of the AND gate 183. In the case in which the selecting signal SEL has a high level, input data D(0) are fetched through the AND gate 182. In the case in which the selecting signal SEL has a low level, input data DM(0) are fetched through the AND gate 183. Consequently, data DI to be supplied to the write amplifier WAP(0) can be divided into D(0) and DM(0) based on age.

Moreover, the output portion OUTP includes an AND gate 184 for obtaining the AND logic of the selecting signal SEL and a data output enable signal DQEN, an AND gate 185 for obtaining the AND logic of the logic inversion signal of the selecting signal SEL and the data output enable signal DQEN, a latch circuit 186 capable of latching the data DQ output from the sense amplifier SAP(0) based on the output signal of the AND gate 184, and a latch circuit 187 capable of latching the data DQ output from the sense amplifier SAP(0) based on the output signal of the AND gate 185. In the case in which the selecting signal SEL has a high level, the output data DQ are output to an outside through the latch circuit 186 based on the output signal of the AND gate 184. In the case in which the selecting signal SEL has a low level, the output data DQ are output to an outside through the latch circuit 187 based on the output of the AND gate 185.

The logic of the selecting signal SEL is controlled by the read/write control circuit 217. For example, the read/write control circuit 217 controls the selecting signal SEL to have a high level when the word line WA is driven into a selection level, and controls the selecting signal SEL to have a low level when the word line WB is driven into the selection level. In the case in which the selecting signal SEL has the high level, consequently, the input data D(0) can be written to the first storage portion MA and the data stored in the first storage portion MA can be read and can be output as data DQ(0) to an outside through the latch circuit 186. In the case in which the selecting signal SEL has the low level, moreover, the input data DM(0) can be written to the second storage portion MB and the data stored in the second storage portion MB can be read and can be output as data DMQ(0) to the outside through the latch circuit 187.

FIG. 2 shows a truth table for the memory cell MC(0, 0). In the truth table, "H" indicates a high level, "L" indicates a low level, "0" indicates a logical value of "0", "1" indicates a logical value of "1", "M" indicates an information holding state, and "Z" indicates a high impedance state. The operation of the memory cell MC(0, 0) includes a write operation, a read operation, a comparing operation and an inactive state.

The write operation will be described. In the write operation, the first comparison data line CD0 and the second comparison data line CD1 are fixed to have the low level so that the match line MATCH is brought into a high impedance state.

In the case in which both of the first and second word lines WA and WB are driven to the high level, the same data can be simultaneously written to both the first storage portion MA and the second storage portion MB. For example, it is possible to write the logical value of "0" to both the first storage portion MA and the second storage portion MB by setting the first data line D0 to have the low level and the second data line D1 to have the high level, and it is possible to write the logical value of "1" to both the first storage portion MA and the second storage portion MB by setting the first data line D0 to have the high level and the second data line D1 to have the low level. In the case in which only the first word line WA is driven into the high level, moreover, it is possible to write the logical value of "0" to the first storage portion MA by setting the first data line D0 to have the low level and the second data line D1 to have the high level and it is possible to write the logical value of "1" to the first storage portion MA by setting the first data line D0 to have the high level and the second data line D1 to have the low level. At this time, the second storage portion MB is brought into an information holding state. In the case in which only the second word line WB is driven into the high level, it is possible to write the logical value of "0" to the second storage portion MB by setting the first data line D0 to have the low level and the second data line D1 to have the high level and it is possible to write the logical value of "1" to the second storage portion MB by setting the first data line D0 to have the high level and the second data line D1 to have the low level. At this time, the first storage portion MA is brought into the information holding state.

Next, the read operation will be described. In the read operation, the first comparison data line CD0 and the second comparison data line CD1 are fixed to have the low level so that the match line MATCH is brought into the high impedance state.

By setting the first word line WA to have the high level and the second word line WB to have the low level, it is possible to read the information stored in the first storage portion MA through the first data line D0 and the second data line D1. By setting the first word line WA to have the low level and the second word line WB to have the high level, moreover, it is possible to read the information stored in the second storage portion MB through the first data line D0 and the second data line D1.

Next, the comparing operation will be described. In the comparing operation, the first word line WA and the second word line WB are fixed to have the low level and the first data line D0 and the second data line D1 are fixed to have the high level.

In the case in which the first comparison data line CD0 is set to have the high level and the second comparison data line CD1 is set to have the low level in a state in which the logical value of "0" is written to the first storage portion MA and the logical value of "0" is written to the second storage portion MB, the match line MATCH is brought into the high impedance state.

In the case in which the first comparison data line CD0 is set to have the high level and the second comparison data line CD1 is set to have the low level in a state in which the logical value of "0" is written to the first storage portion MA and the logical value of "1" is written to the second storage portion MB, the match line MATCH is brought into the high impedance state.

In the case in which the first comparison data line CD0 is set to have the high level and the second comparison data line CD1 is set to have the low level in a state in which the logical value of "1" is written to the first storage portion MA and the logical value of "0" is written to the second storage portion MB, both of the n-channel type MOS transistors MCA and MC0 forming the first comparing circuit 11 are conducted so that the match line MATCH is set to have the low level.

In the case in which the first comparison data line CD0 is set to have the high level and the second comparison data line CD1 is set to have the low level in a state in which the logical value of "1" is written to the first storage portion MA and the logical value of "1" is written to the first storage portion MB, both of the n-channel type MOS transistors MCA and MC0 forming the first comparing circuit 11 are conducted so that the match line MATCH is set to have the low level.

In the case in which the first comparison data line CD0 is set to have the low level and the second comparison data line CD1 is set to have the high level in a state in which the logical value of "0" is written to the first storage portion MA and the logical value of "0" is written to the second storage portion MB, the match line MATCH is brought into the high impedance state.

In the case in which the first comparison data line CD0 is set to have the low level and the second comparison data line CD1 is set to have the high level in a state in which the logical value of "0" is written to the first storage portion MA and the logical value of "1" is written to the second storage portion MB, the n-channel type MOS transistors MCB and MC1 in the second comparing circuit 12 are conducted so that the match line MATCH is set to have the low level.

In the case in which the first comparison data line CD0 is set to have the low level and the second comparison data line CD1 is set to have the high level in a state in which the logical value of "1" is written to the first storage portion MA and the logical value of "0" is written to the second storage portion MB, the match line MATCH is brought into the high impedance state.

In the case in which the first comparison data line CD0 is set to have the low level and the second comparison data line CD1 is set to have the high level in a state in which the logical value of "1" is written to the first storage portion MA and the logical value of "1" is written to the second storage portion MB, the n-channel type MOS transistors MCB and MC1 in the second comparing circuit 12 are conducted so that the match line MATCH is set to have the low level.

In the state in which the logical value of "0" is written to the first storage portion MA and the logical value of "1" is written to the second storage portion MB as described above, the memory cell MC(0, 0) is set to have the logical value of "0" and the first comparison data line CD0 and the second comparison data line CD1 are set to have a complementary level so that a comparison with comparing data is carried out and a result is output to the match line MATCH. In the state in which the logical value of "1" is written to the first storage portion MA and the logical value of "0" is written to the second storage portion MB as described above, moreover, the memory cell MC(0, 0) is set to have the logical value of "1" and the first comparison data line CD0 and the second comparison data line CD1 are set to have the complementary level so that the comparison with the comparing data is carried out and a result is output to the match line MATCH. In the state in which the logical value of "0" is written to the first storage portion MA and the logical value of "0" is written to the second storage portion MB as described above, furthermore, the memory cell MC(0, 0) is brought into a don't-care state (a logical value of "X") and the match line MATCH is brought into the high impedance state irrespective of the levels of the first comparison data line CD0 and the second comparison data line CD1.

In the inactive state, the first and second word lines WA and WB are set to have the low level so that the first storage portion MA and the second storage portion MB are brought into the information holding state, and the first data line D0 and the second data line D1 are set to have the low level and the first comparison data line CD0 and the second comparison data line CD1 are set to have the low level so that the match line MATCH is set to have a high impedance.

FIG. 15A and FIG. 15B show examples of the operation of the memory cell MC(0, 0). FIG. 15A shows a timing for the write or read operation.

The data line D0 is set to have the low level in a state in which the word line WA is driven into the selection level, and the data line D1 is set to have the low level in a state in which the word line WB is selected, and the logical value of "0" is thus written. The data line D1 is set to have the low level in a state in which the word line WA is driven into the selection level, and the data line D0 is set to have the low level in a state in which the word line WB is selected, and the logical value of "1" is thus written. The data line D0 is set to have the low level in a state in which the word line WA is driven into the selection level, and the data line D0 is set to have the low level in a state in which the word line WB is selected, and the don't-care state (the logical value of "X") is thus written.

FIG. 15B shows a timing for the comparing operation. The match line MATCH is precharged into the high level in a state in which the comparison data lines CD0 and CD1 have the low level before the comparing operation, and either the comparison data line CD0 or the comparison data line CD1 which corresponds to the comparison data is set to have the high level after the completion of the precharging. Thus, the comparing operation is carried out.

It is indicated that the comparing data transmitted through the comparison data lines CD0 and CD1 and the stored data are matched with each other in the case in which the match line MATCH has the high level after the comparing operation. It is indicated that the comparing data transmitted through the comparison data lines CD0 and CD1 and the stored data are not matched with each other in the case in which the match line MATCH has the low level. In the case in which both of the comparison data lines CD0 and CD1 have the low level, a mask state is brought and the comparison is not carried out.

Figure 3:
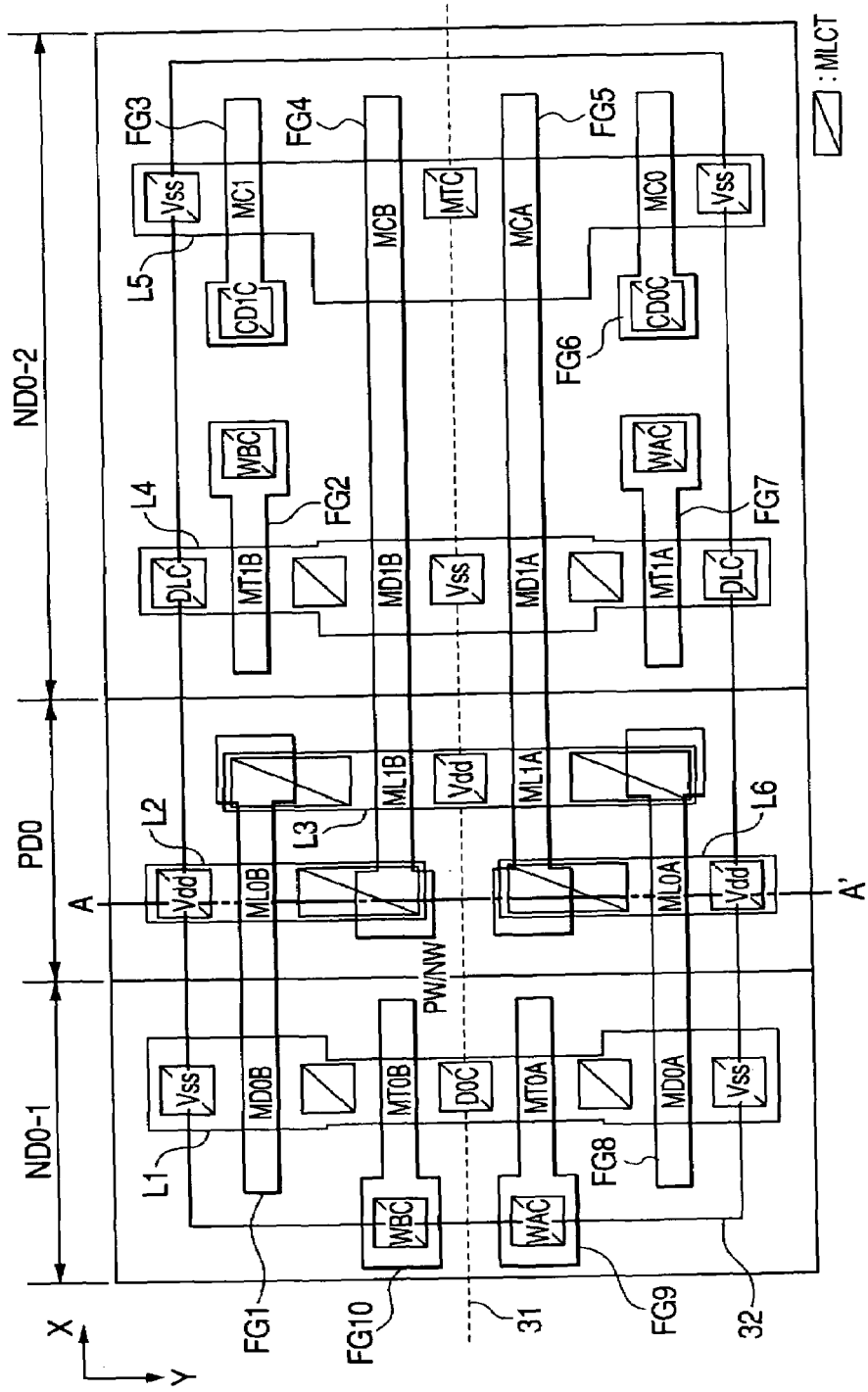
FIG. 3 is an explanatory diagram showing a layout in the memory cell.
Figure 4:
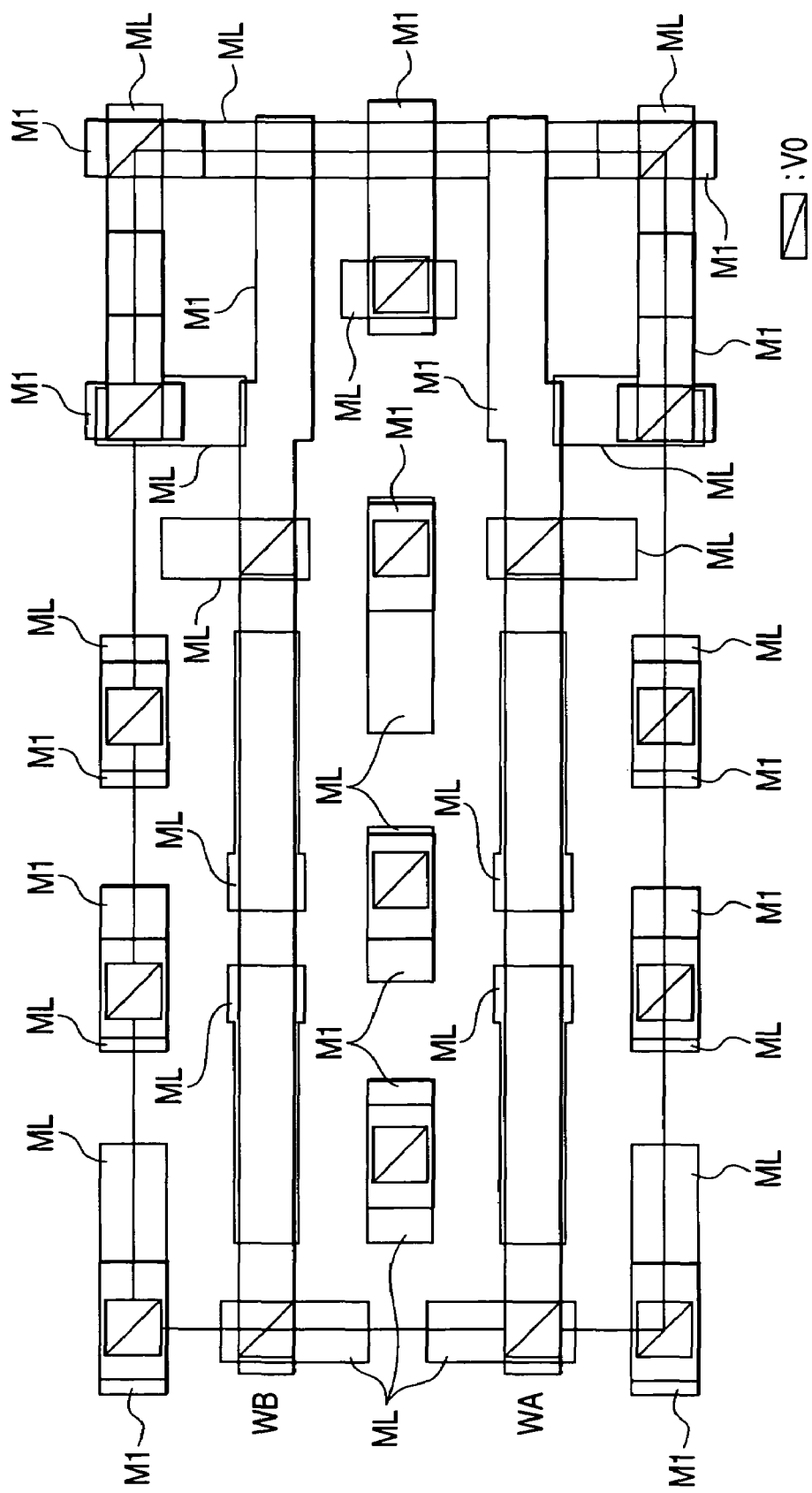
FIG. 4 is an explanatory diagram showing the layout in the memory cell.
Figure 5:
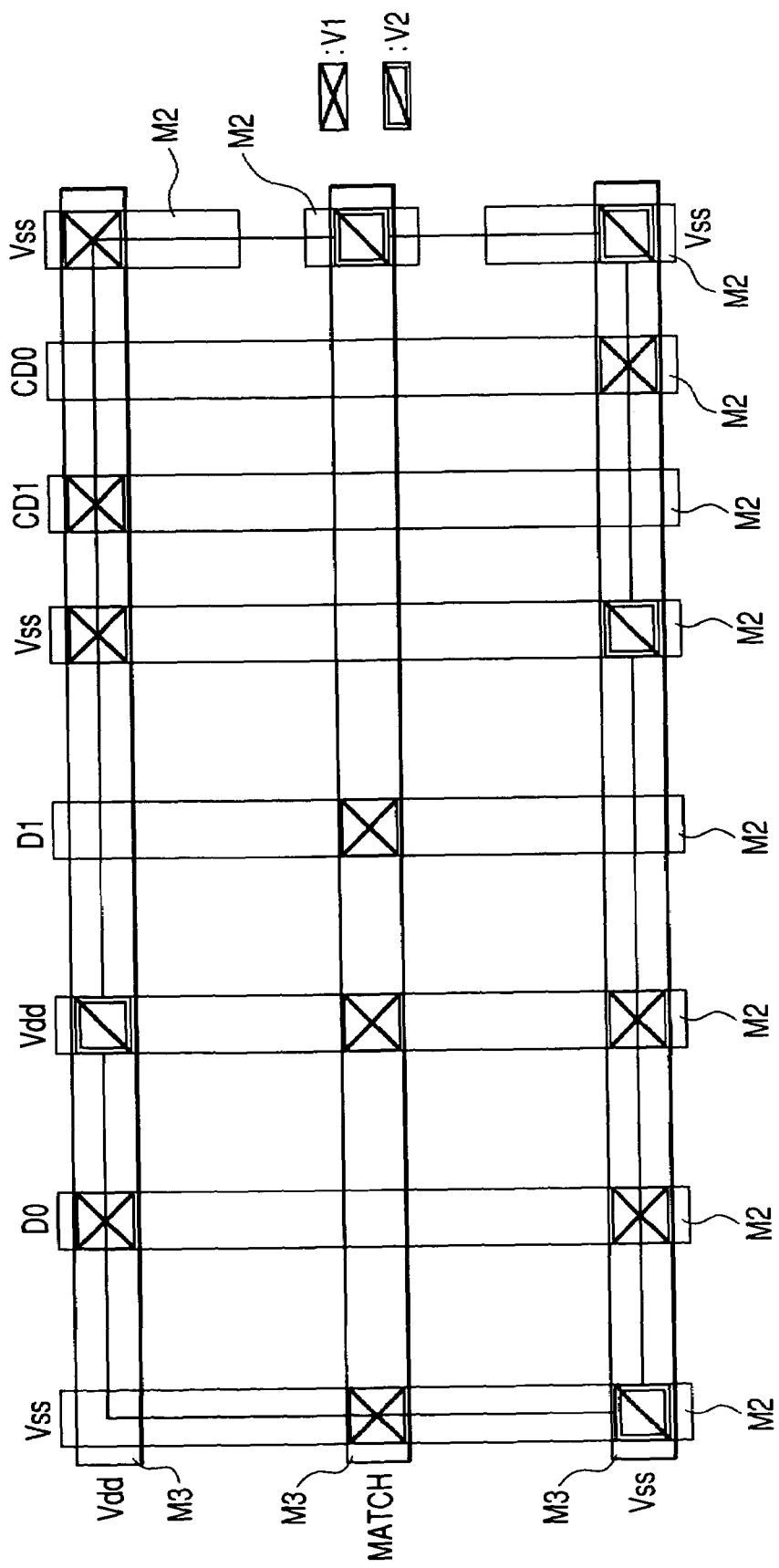
FIG. 5 is an explanatory diagram showing the layout in the memory cell.
Figure 21:
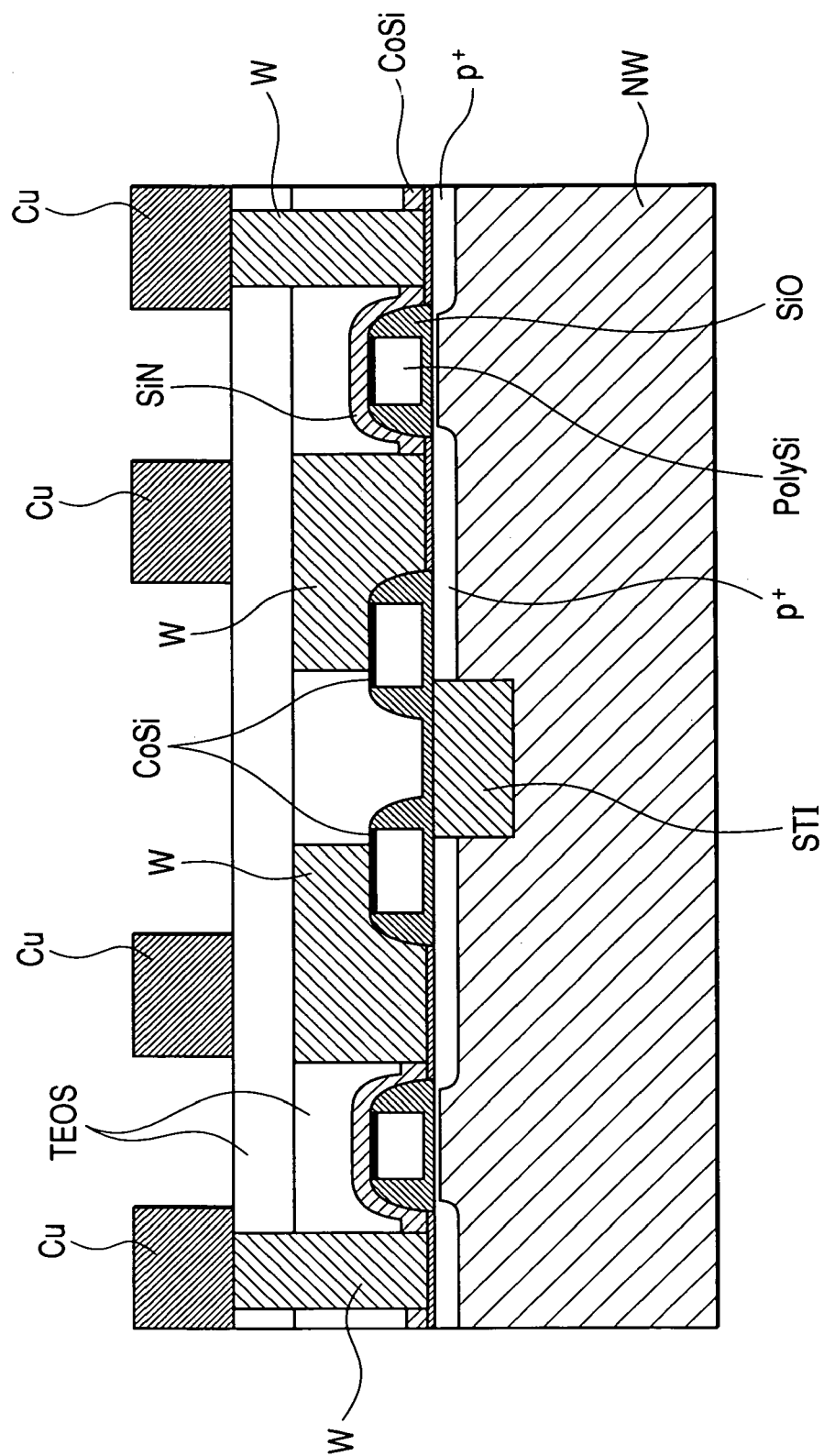
FIG. 21 is a sectional view taken along a line A–A' in FIG. 3.

FIG. 3 shows diffusion layers and gates in the memory cell MC(0, 0), FIG. 4 shows a lowermost metal layer and a first metal layer in the memory cell MC(0, 0), and FIG. 5 shows a second metal layer and a third metal layer in the memory cell MC(0, 0). Moreover, FIG. 21 shows a section taken along a line A–A' in FIG. 3. The p-type diffusion layers of the p-channel type MOS transistors ML0B and ML0A in the memory cell are formed with an insulating layer (STI) interposed therebetween in an n well (NW). Gate layers (FG4, FG5) of the p-channel type MOS transistors ML1B and ML1A are extended to this section respectively and are caused to come in contact with a drain side in the p-type diffusion layers of the p-channel type MOS transistors ML0B and ML0A through a tungsten plug (W).

In FIG. 3, L1 to L6 denote a diffusion layer and FG1 to FG10 denote a gate. ND0-1 and ND0-2 denote a p-well layer and PD0 denotes an n well layer. The n well (PD0) is formed between the two p wells (ND0-1, ND0-2), and the n-channel type MOS transistors MD0B, MT0B, MT0A and MD0A are formed in the p well ND0-1. The p-channel type MOS transistors ML0B, ML1B, ML1A and ML0A are formed in the n well PD0, and the n-channel type MOS transistors MT1B, MD1B, MD1A, MT1A, MC1, MCB, MCA and MC0 are formed in the p well ND0-2. More specifically, memory cells of a static type which are point symmetrical with each other are used for the first storage portion (MA) and the second storage portion (MB) respectively, and are provided to be line symmetrical about an axis 31 which is parallel with the direction of the word line. One of the transfer and driving MOS transistors making a pair and the comparing circuit are formed in the common well (ND0-2). A lowermost metal layer ML and a first metal layer M1 shown in FIG. 4 are provided on the diffusion layer shown in FIG. 3, and a second metal layer M2 and a third metal layer M3 shown in FIG. 5 are provided thereon. The material of the wiring of the lowermost metal layer ML is set to be tungsten (W), the materials of the wirings of the first metal layer M1 to the third metal layer M3 are set to be copper (Cu), and the materials of a contact and a through hole are set to be tungsten (W). The diffusion layer and the lowermost metal layer ML are coupled to each other through a contact hole MLCT, the lowermost metal layer ML and the first metal layer M1 are coupled to each other via a through hole V0, the first metal layer M1 and the second metal layer M2 are coupled to each other via a through hole V1, and the second metal layer M2 and the third metal layer M3 are coupled to each other via a through hole V2.

The gates FG1 to FG10 are extended in the direction of an arrow X and are formed in parallel with each other, and are arranged to be line symmetrical with respect to the center line 31 passing through the center of the memory cell MC(0, 0). For such a layout, the diffusion layers L1 to L6 are prevented from being bent and are formed in parallel with a well boundary line (a boundary line between ND0-1 and PD0, and ND0-2). In particular, the gate electrodes of the MOS transistors ML1B, MD1B and MCB are shared by FG4, and the gate electrodes of the MOS transistors ML1A, MD1A and MCA are shared by FG5. Consequently, it is possible to reduce the number of contacts in the structure of the circuit.

Furthermore, the data line D0 is shared by one of the storage nodes in each of the first storage portion MA and the second storage portion MB, the data line D1 is shared by the other storage node in each of the first storage portion MA and the second storage portion MB, and the output signal of the storage node 13 in the first storage portion MA is transmitted to the gate electrode of the n-channel type MOS transistor MCA in the comparing circuit 11 and the output signal of the storage node 15 in the second storage portion MB is transmitted to the gate electrode of the n-channel type MOS transistor MCB in the comparing circuit 12. Consequently, it is possible to achieve the easiness of a layout which is line symmetrical with respect to the center line 31.

By such a layout that the data lines D0 and D1 are interposed between the second metal layer M2 of the low potential side power supply Vss and the second metal layer M2 of the high potential side power supply Vdd and the comparison data lines CD1 and CD0 are interposed between the second metal layers M2 of two low potential side power supplies Vss as shown in FIG. 5, the shielding functions of the low potential side power supply Vss and the high potential side power supply Vdd are exhibited. Consequently, a noise caused by a change in the logical levels of the comparison data lines CD0 and CD1 can be prevented from being made over the data lines D0 and D1 handling a micro signal.

Figure 14:
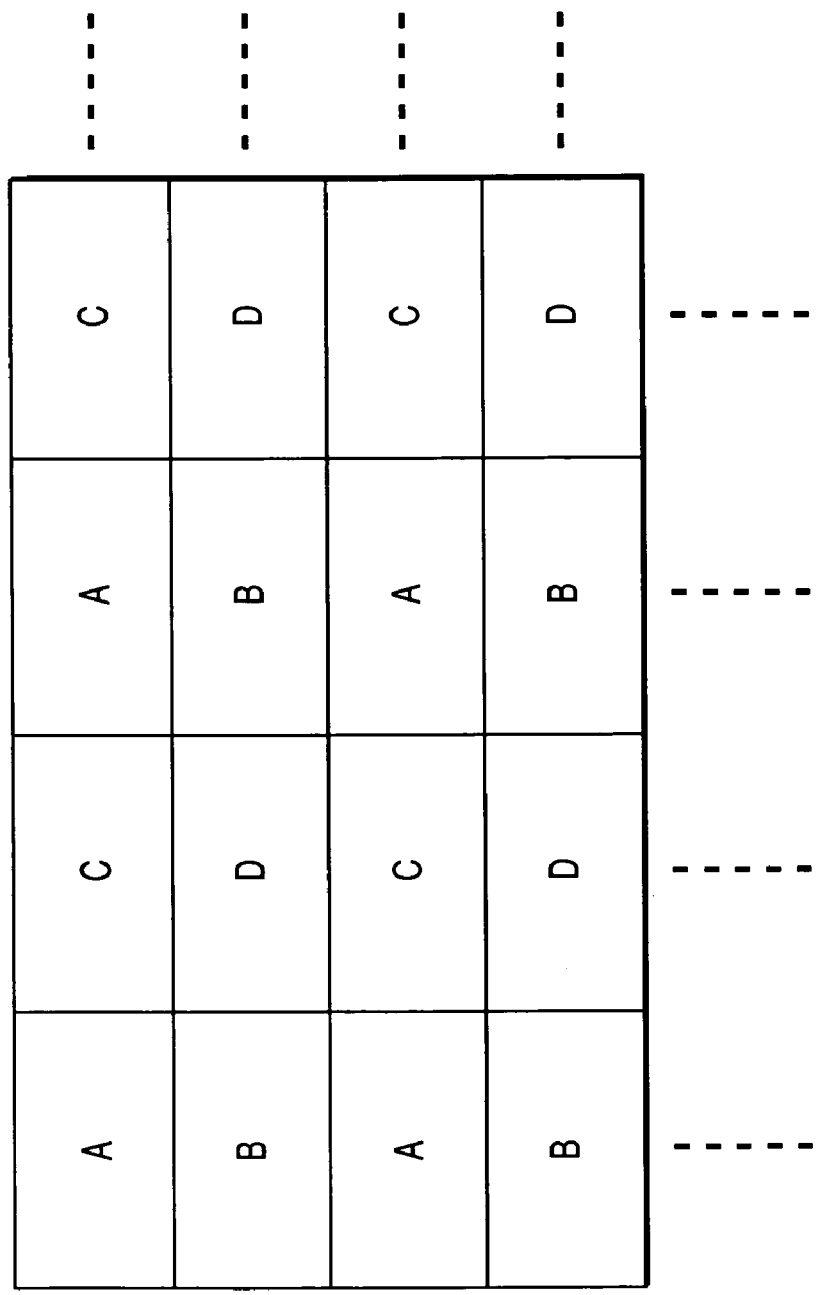
FIG. 14 is an explanatory diagram showing an example of an arrangement in which a plurality of memory cells is disposed.

In order to reduce a layout area, the contact hole is shared. For example, the drain electrode of the n-channel type MOS transistor MCA in the first comparing circuit 11 and the drain electrode of the n-channel type MOS transistor MCB in the second comparing circuit 12 are coupled to the match line MATCH through a common contact hole MTC. By sharing the contact hole MTC, thus, it is possible to more reduce the layout area as compared with the individual formation of the contact holes for the drain electrode of the n-channel type MOS transistor MCA and the drain electrode of the n-channel type MOS transistor MCB, respectively. Moreover, a contact hole for the high potential side power supply vdd (which is indicated as Vdd), a contact hole for the low potential side power supply Vss (which is indicated as Vss) and a contact hole DLC for a data line are provided on a boundary line 32 corresponding to one bit. In the case in which a plurality of memory cells is provided vertically and transversely, each of the contact holes provided on the boundary line 32 corresponding to one bit can be shared between adjacent memory cells. Consequently, it is possible to reduce the chip occupation area of the CAM array 211. In this case, it is preferable that the direction of the array of the memory cell should be properly changed as shown in FIG. 14, for example. In FIG. 14, "A" indicates an arrangement in a direction shown in FIGS. 3 to 5. In the case in which the same arrangement is set to be an arrangement in a positive direction, "B" indicates an arrangement which is line symmetrical based on an X-axis, C indicates an arrangement which is line symmetrical based on a Y axis, and D indicates an arrangement which is line symmetrical based on both of the X and Y axes. According to such an arrangement, the contact hole positioned on the boundary line 32 corresponding to one bit can be shared by the adjacent memory cells.

As compared with the case in which a special contact hole for each memory cell is to be formed, consequently, the number of the contact holes can be more reduced and the layout area can be more decreased.

According to the example described above, the following functions and advantages can be obtained.

(1) The diffusion layers L1 to L6 are formed in parallel with each other in the direction of the arrow Y and bending is suppressed. For this reason, it is not necessary to carry out a pattern correction in a bent portion.

(2) The memory cells MC(0, 0) to MC(m−1, n−1) are arranged to be line symmetrical with respect to the center line 31 passing through the center thereof, and furthermore, the direction of the formation of the gate electrode is unified into the direction of the arrow X. Consequently, a manufacturing process condition can easily be optimized. Therefore, a variation in a manufacturing process is lessened and the microfabrication of the memory cell can be carried out, and furthermore, the area of a semiconductor chip can be reduced and the number of acquired chips and a yield can be improved. Thus, a manufacturing cost can be reduced.

(3) In the case in which the memory cells MC(0, 0) to MC(m−1, n−1) arranged to be line symmetrical with respect to the center line 31 are provided in an array as shown in FIG. 16, an electrode and a contact can be shared between memory cells which are adjacent to each other as shown in FIG. 14. Consequently, more memory cells can be arranged in a limited layout area. Thus, the performance of the IP address search unit 210 can be enhanced.

(4) The gate electrodes of the MOS transistors ML1A, MD1A and MCA are shared by FG5 so that the storage node MA and the first comparing circuit 11 can be directly connected to each other, and the gate electrodes of the MOS transistors ML1B, MD1B and MCB are shared by FG4 so that the second storage node MB and the second comparing circuit 12 can be directly connected to each other. Consequently, extra contacts and electrodes are not required.

(5) In a comparison, the potential level of the gate electrode of the MOS transistor MCA in the first comparing circuit 11 and that of the gate electrode of the MOS transistor MCB in the second comparing circuit 12 are fixed by the electric potentials of the corresponding storage nodes 13 and 15, respectively. In the first comparing circuit 11 and the second comparing circuit 12, therefore, the influence of so-called charge sharing which is peculiar to a dynamic circuit is eliminated. Consequently, it is possible to prevent an undesirable noise from being made over the match line MATCH, thereby stabilizing the operation of the circuit.

(6) In such a layout that the data lines D0 and D1 are interposed between the second metal layer M2 of the low potential side power supply Vss and the second metal layer M2 of the high potential side power supply Vdd and the comparison data lines CD1 and CD0 are interposed between the two low potential side power supplies Vss as shown in FIG. 5, the shielding functions of the low potential side power supply Vss and the high potential side power supply Vdd are exhibited. Consequently, a noise caused by the change in the logic levels of the comparison data lines CD0 and CD1 can be prevented from being made over the data lines D0 and D1 handling a micro signal. Consequently, the reliability of the result of the comparison can be enhanced.

Figure 6:
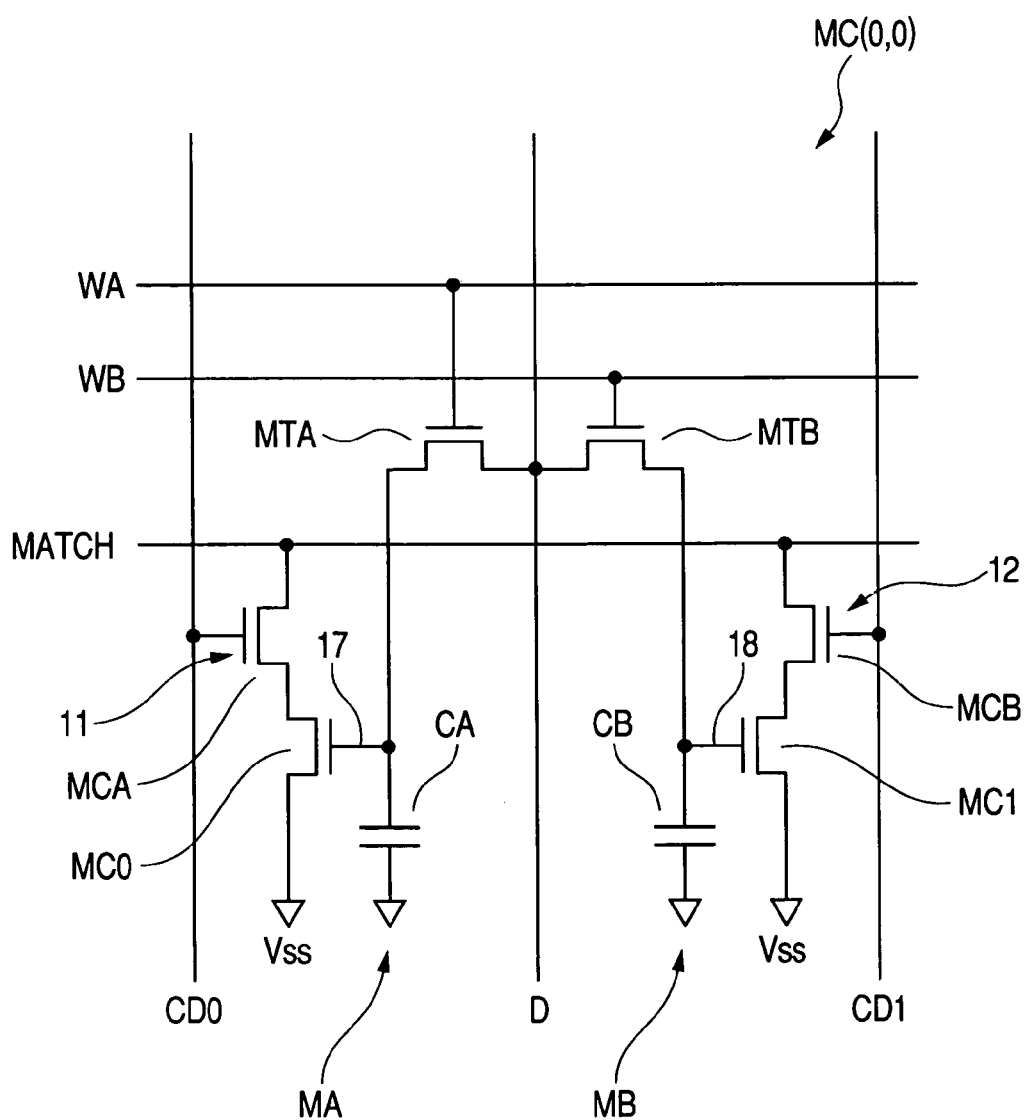
FIG. 6 is a circuit diagram showing an example of a different structure from the structure of the memory cell.

While the first storage portion MA and the second storage portion MB in the memory cells MC(0, 0) to MC(m−1, n−1) are of the static type in the example, a dynamic type can be employed. An example of the structure of the memory cell MC(0, 0) in that case is shown in FIG. 6. The structure shown in FIG. 6 is greatly different from the structure shown in FIG. 1 in that the first storage portion MA and the second storage portion MB are of the dynamic type, and they are common in that the data line D is shared by the first storage portion MA and the second storage portion MB except that a single data line is used in place of two complementary data lines.

In FIG. 6, the first storage portion MA includes an n-channel type MOS transistor MTA and a charge storage capacitance CA coupled thereto, and the second storage portion MB includes an n-channel type MOS transistor MTB and a charge storage capacitance CB coupled thereto. The charge storage capacitance CA has one of ends coupled to the low potential side power supply Vss and the other end coupled to the data line D through then-channel type MOS transistor MTA. The charge storage capacitance CB has one of ends coupled to the low potential side power supply Vss and the other end coupled to the data line D through the n-channel type MOS transistor MTB. The gate electrode of the n-channel type MOS transistor MTA is coupled to the word line WA, and the gate electrode of the n-channel type MOS transistor MTB is coupled to the word line WB. In the case in which the word line WA is driven into a selection level, the n-channel type MOS transistor MTA is conducted so that data transmitted through the data D can be written to the charge storage capacitance CA, and furthermore, the data stored in the charge storage capacitance CA can be read onto the data line D. In the case in which the word line WB is driven into the selection level, the n-channel type MOS transistor MTB is conducted so that data transmitted through the data D can be written to the charge storage capacitance CB, and furthermore, the data stored in the charge storage capacitance CB can be read onto the data line D. In the first comparing circuit 11, the n-channel type MOS transistors MCA and MC0 are connected in series, the gate electrode of the n-channel type MOS transistor MCA is coupled to the first comparison data line CD0, and the gate electrode of the n-channel type MOS transistor MC0 is coupled to a storage node 17 of the first storage portion MA. In the second comparing circuit 12, the n-channel type MOS transistors MCB and MC1 are connected in series, the gate electrode of the n-channel type MOS transistor MCB is coupled to the first comparison data line CD1, and the gate electrode of the n-channel type MOS transistor MC1 is coupled to a storage node 18 of the second storage portion MB.

FIG. 7 shows a truth table for the memory cell MC(0, 0) illustrated in FIG. 6. A truth value in each of a write operation, a read operation, a comparing operation and an inactive state is the same as that in FIG. 2 except that only one data line is provided.

Figure 8:
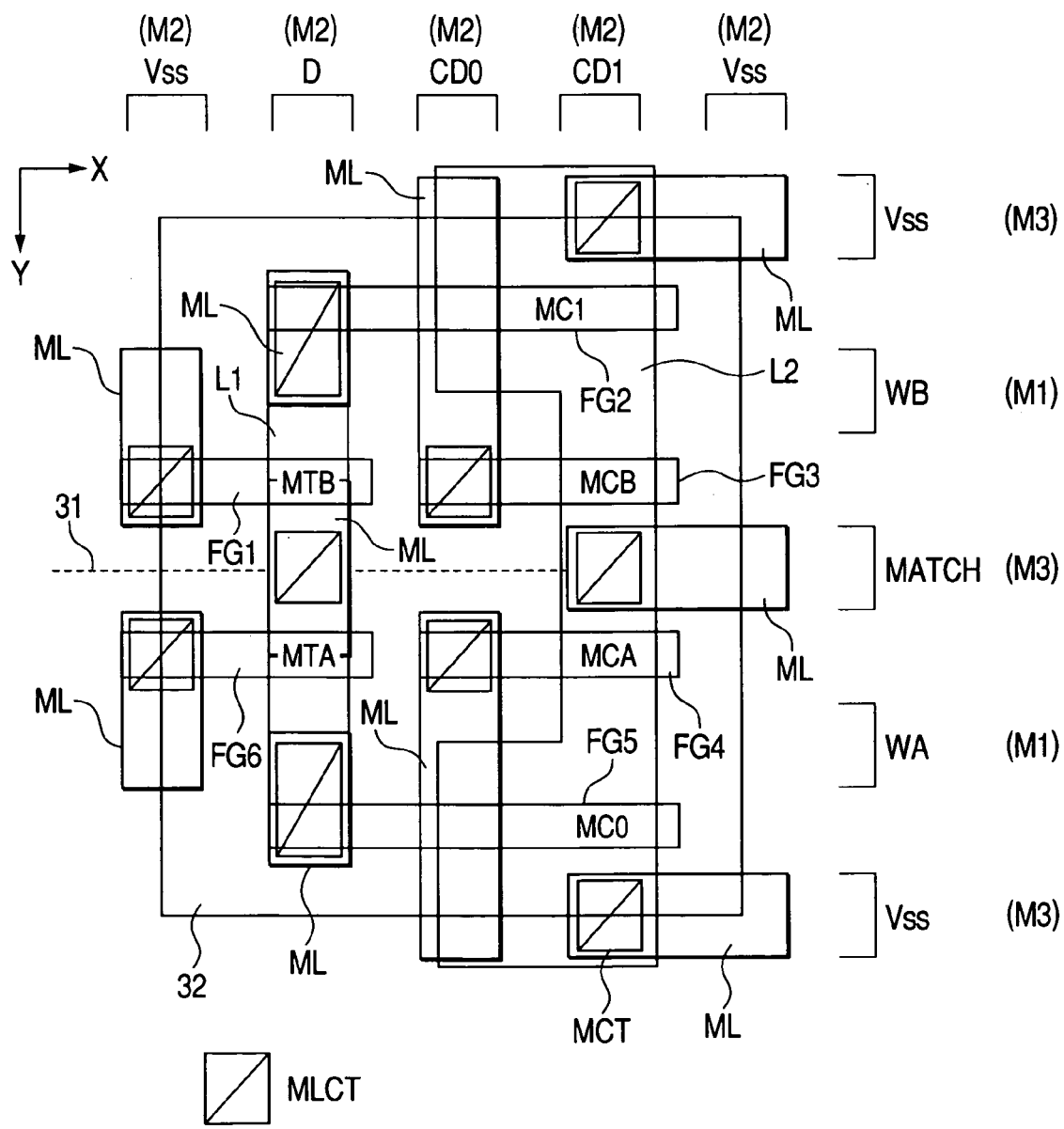
FIG. 8 is an explanatory diagram showing the layout of the memory cell illustrated in FIG. 6.

FIG. 8 shows an example of the layout of the memory cell MC(0, 0) illustrated in FIG. 6. In FIG. 6, the metal wiring layers M1 to M3 are omitted.

In FIG. 8, L1 and L2 denote a diffusion layer and FG1 to FG6 denote a gate. The gates FG1 to FG6 are parallel with the direction of formation (the direction of an arrow X) and are arranged to be line symmetrical with respect to the center line 31 passing through the center of the memory cell MC(0, 0). Thus, a layout is obtained in basically the same manner as in the memory cell MC(0, 0) shown in FIG. 1. Even if the first storage portion MA and the second storage portion MB in the memory cells MC(0, 0) to MC(m−1, n−1) are of a dynamic type, accordingly, it is possible to obtain the same functions and advantages as those in the example described above.

While the description has been given to the case in which the memory cell is of the ternary type in the example, the memory cells MC(0, 0) to MC(m−1, n−1) may be of a binary type as will be described below.

Figure 9:
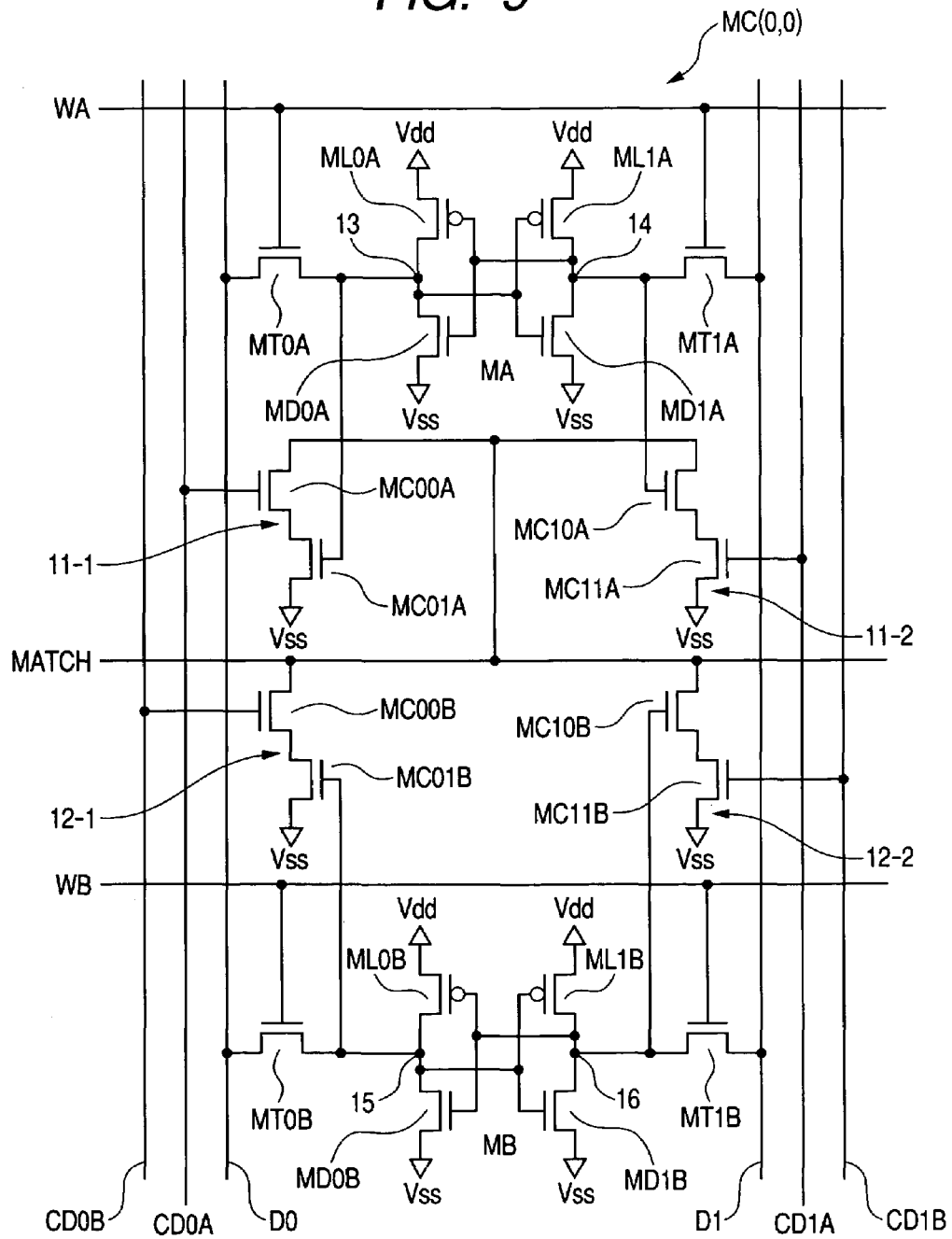
FIG. 9 is a circuit diagram showing an example of a different structure from the structure of the memory cell.

FIG. 9 shows an example of the structure of the memory cell of the binary type.

In the structure shown in FIG. 9, there are provided a first comparison data line CD0A, a second comparison data line CD1A, a third comparison data line CD0B and a fourth comparison data line CD1B. An n-channel type MOS transistor MC00A coupled to the first comparison data line CD0A and an n-channel type MOS transistor MC01A coupled to the storage node 13 in the first storage portion MA are connected in series so that a first comparing circuit 11-1 is formed. An n-channel type MOS transistor MC10A coupled to the other storage node 14 in the first storage portion MA and an n-channel type MOS transistor MC11A coupled to the second comparison data line CD1A are connected in series so that a second comparing circuit 11-2 is formed. An n-channel type MOS transistor MC00B coupled to the third comparison data line CD0B and an n-channel type MOS transistor MC01B coupled to the storage node 15 in the second storage portion MB are connected in series so that a third comparing circuit 12-1 is formed. An n-channel type MOS transistor MC10B coupled to the other storage node 16 in the second storage portion MB and an n-channel type MOS transistor MC11B coupled to the fourth comparison data line CD1B are connected in series so that a fourth comparing circuit 12-2 is formed.

FIG. 10 shows a truth table for the memory cell of the binary type illustrated in FIG. 9. A basic operation is the same as that of the ternary type shown in FIG. 1. In case of the memory cell of the binary type, there are provided two sets of comparison data lines CD0A, CD1A, CD0B and CD1B, and comparing data corresponding to 2 bits can be fetched to compare the same data with the data stored in the first and second storage portions MA and MB. For this reason, the number of combinations of the comparing operation is larger than that in case of the ternary type (see FIG. 2).

Figure 11:
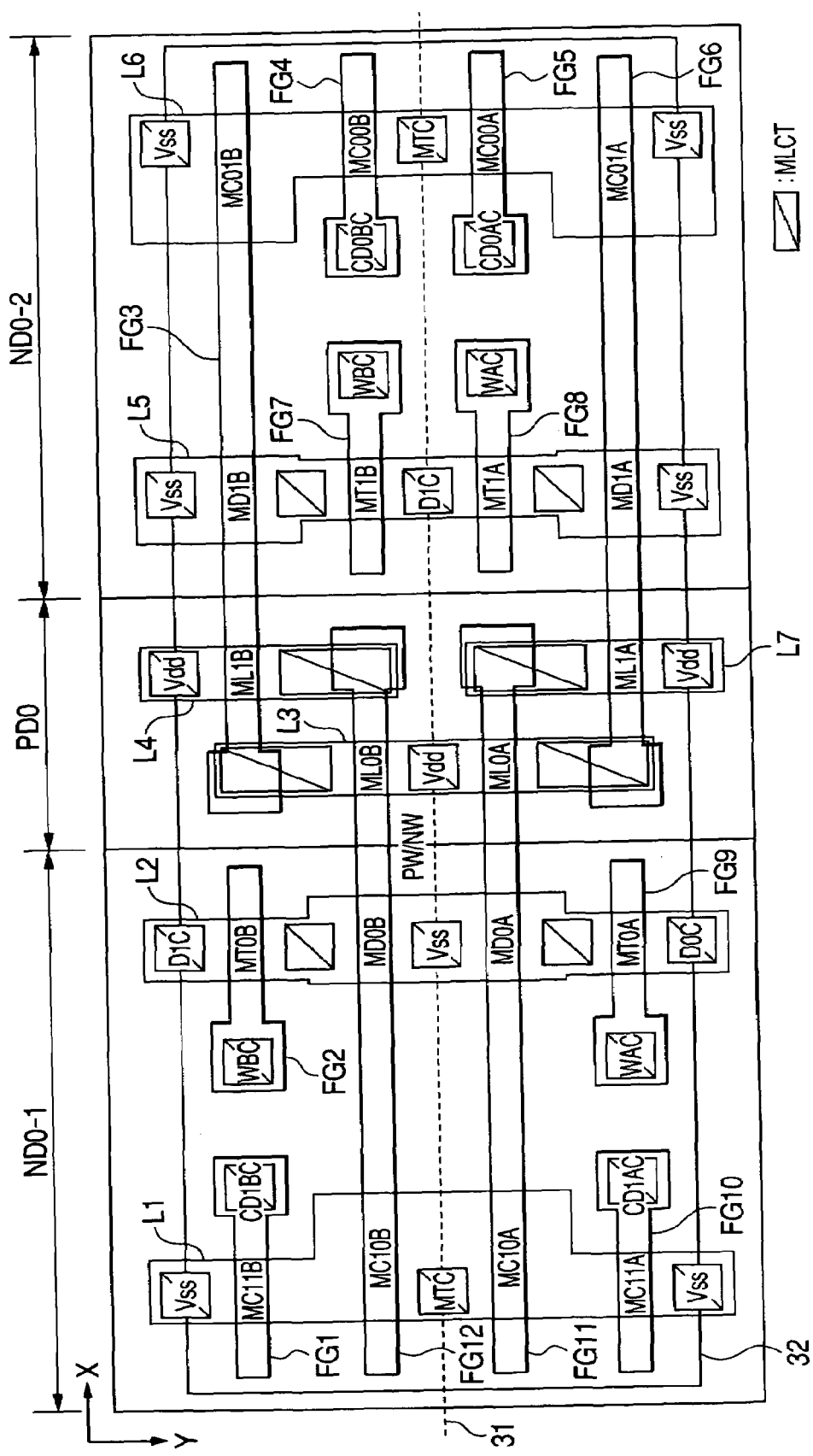
FIG. 11 is an explanatory diagram showing the layout of the memory cell illustrated in FIG. 9.
Figure 12:
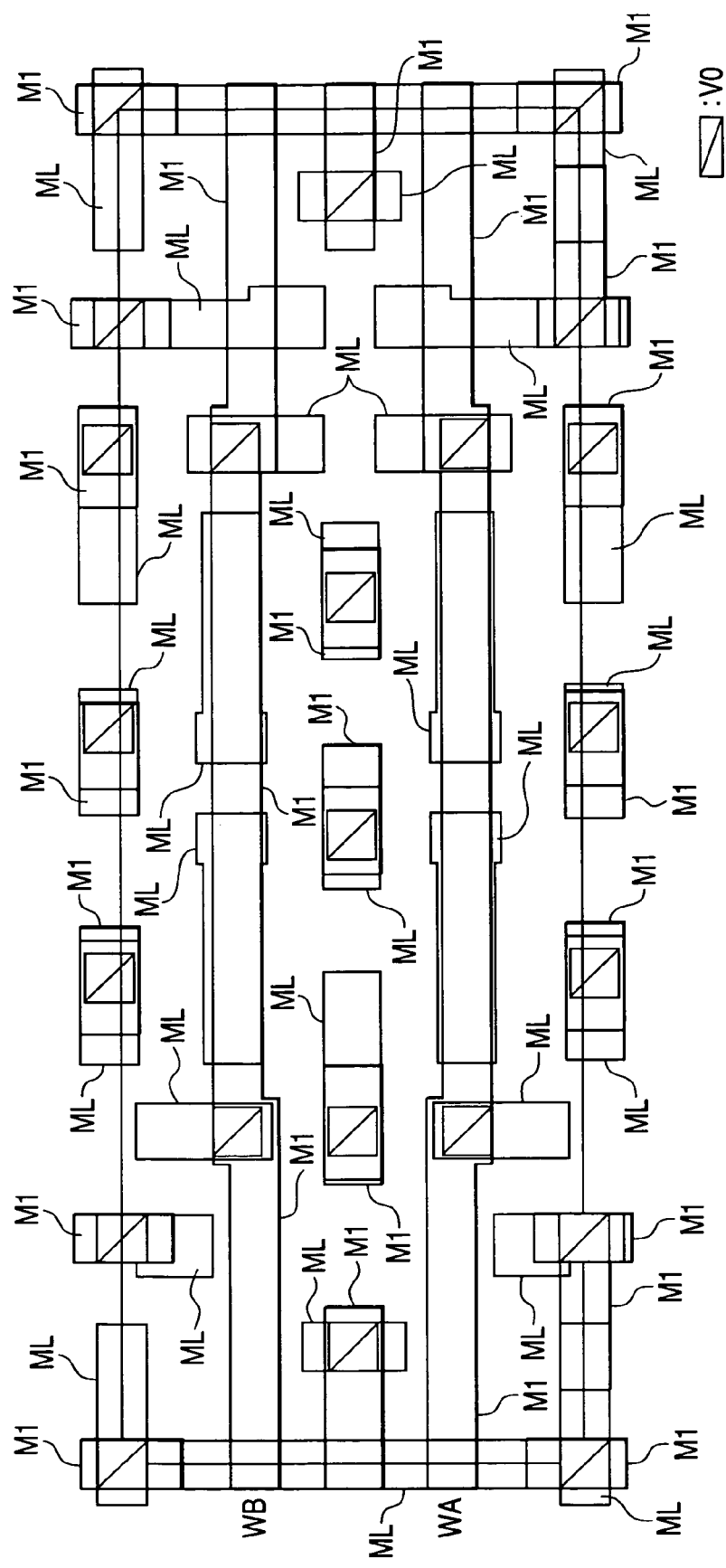
FIG. 12 is an explanatory diagram showing the layout of the memory cell illustrated in FIG. 9.
Figure 13:
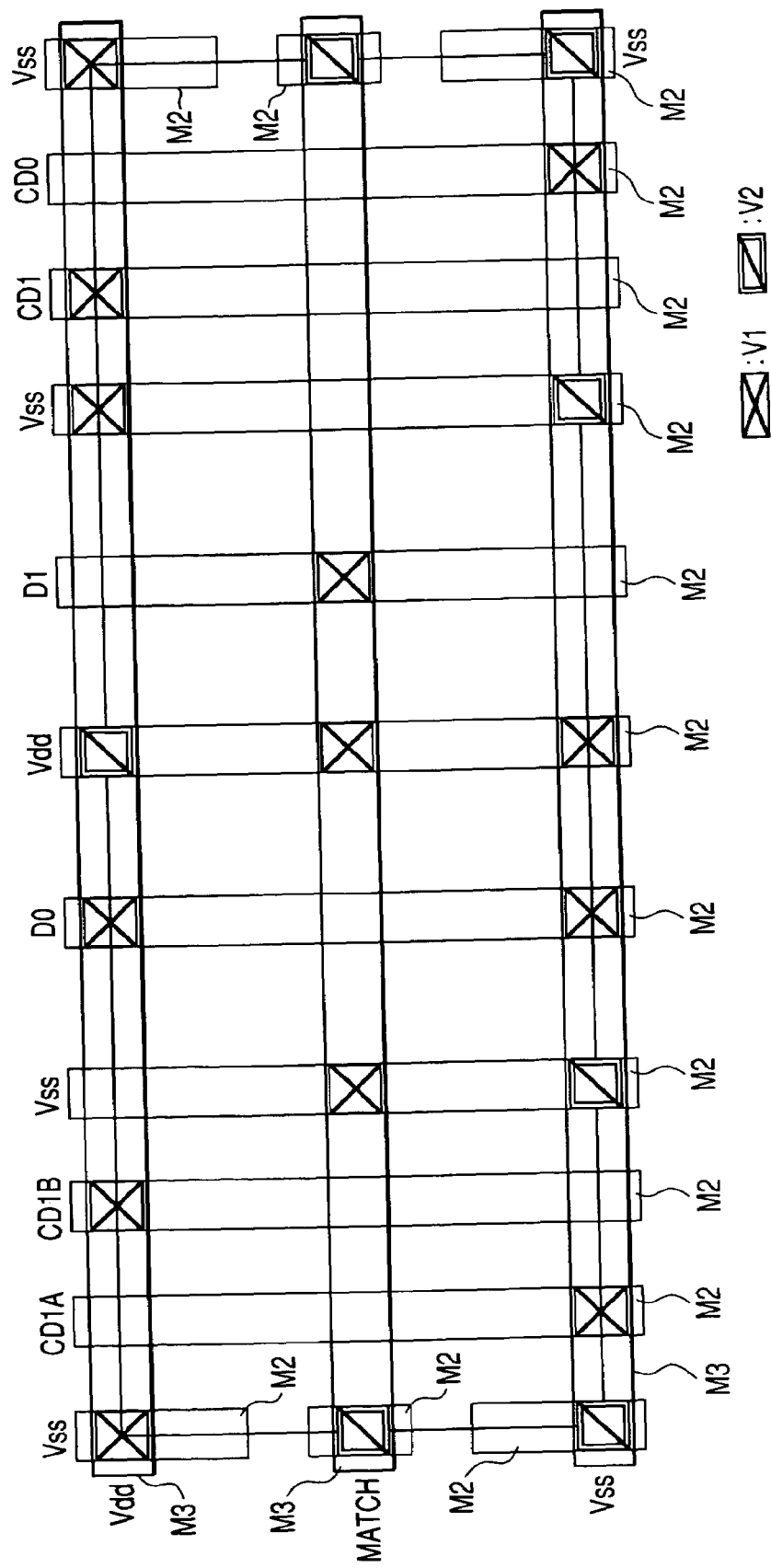
FIG. 13 is an explanatory diagram showing the layout of the memory cell illustrated in FIG. 9.

FIG. 11 shows diffusion layers and gates in the memory cell illustrated in FIG. 9, FIG. 12 shows a lowermost metal layer and a first metal layer in the memory cell, and FIG. 13 shows a second metal layer and a third metal layer in the memory cell.

In FIG. 11, L1 to L7 denote a diffusion layer and FG1 to FG12 denote a gate. ND0-1 and ND0-2 denote an implanted layer for forming a p well and PD0 denotes an implanted layer for forming an n well. By utilizing the implanted layer ND0-1, n-channel type MOS transistors MC11B, MC10B, MC10A, MC11A, MT0B, MD0B, MD0A and MT0A are formed. By utilizing the implanted layer PD0, p-channel type MOS transistors ML0B, ML0A, ML1B and ML1A are formed. By utilizing the implanted layer ND0-2, n-channel type MOS transistors MD1B, MT1B, MT1A, MD1A, MC01B, MC00B, MC00A and MC01A are formed. A lowermost metal layer ML and a first metal layer M1 shown in FIG. 12 are provided on the diffusion layer shown in FIG. 11, and a second metal layer M2 and a third metal layer M3 shown in FIG. 13 are provided thereon. The diffusion layer and the lowermost metal layer ML are coupled to each other via a contact hole MLCT, the lowermost metal layer ML and the first metal layer M1 are coupled to each other via a through hole V0, the first metal layer M1 and the second metal layer M2 are coupled to each other via a through hole V1, and the second metal layer M2 and the third metal layer M3 are coupled to each other via a through hole V2.

The gates FG1 to FG12 are extended in the direction of an arrow X and are formed in parallel with each other, and are arranged to be line symmetrical with respect to the center line 31 passing through the center of the memory cell MC(0, 0). For such a layout, the diffusion layers L1 to L7 can be prevented from being bent and are formed in parallel with a well boundary line (a boundary line between the implanted layers ND0-1 and PD0, and ND0-2). In particular, the gate electrodes of the MOS transistors MC10B, MD0B and ML0B are shared by FG12, the gate electrodes of the MOS transistors MC10A, MD0A and ML0A are shared by FG11, the gate electrodes of the MOS transistors ML1B, MD1B and MC01B are shared by FG3, and the gate electrodes of the MOS transistors ML1A, MD1A and MC01A are shared by FG6. Consequently, it is possible to reduce the number of contacts in the structure of the circuit.

Furthermore, a data line D0 is shared by one of the storage nodes in each of the first storage portion MA and the second storage portion MB, and a data line D1 is shared by the other storage node in each of the first storage portion MA and the second storage portion MB. Consequently, it is possible to achieve the easiness of a layout which is line symmetrical with respect to the center line 31.

As shown in FIG. 13, the second metal layer M2 of a high potential side power supply Vdd or a low potential side power supply Vss is provided between the data lines D0 and D1 and the comparison data lines CD0A, CD1A, CD0B and CD1B, and shielding is carried out to reduce a noise over the data lines D0 and D1.

In order to reduce a layout area, the contact hole is shared. For example, the drain electrodes of the MOS transistors MC00A, MC10A, MC00B and MC10B in the first comparing circuit 11-1, the second comparing circuit 11-2, the third comparing circuit 12-1 and the fourth comparing circuit 12-2 are coupled to the match line MATCH through a common contact hole MTC. By sharing the contact hole MTC, thus, it is possible to reduce the layout area.

Moreover, a contact hole for the high potential side power supply vdd (which is indicated as Vdd), a contact hole for the low potential side power supply Vss (which is indicated as Vss) and a contact hole DLC for a data line are provided on the boundary line 32 corresponding to one bit. In the case in which a plurality of memory cells is provided vertically and transversely, each of the contact holes provided on the boundary line 32 corresponding to one bit can be shared between adjacent memory cells. Consequently, it is possible to reduce the chip occupation area of the CAM array 211. At this time, it is preferable that the direction of the array of the memory cell should be properly changed as shown in FIG. 14, for example.

Figure 17:
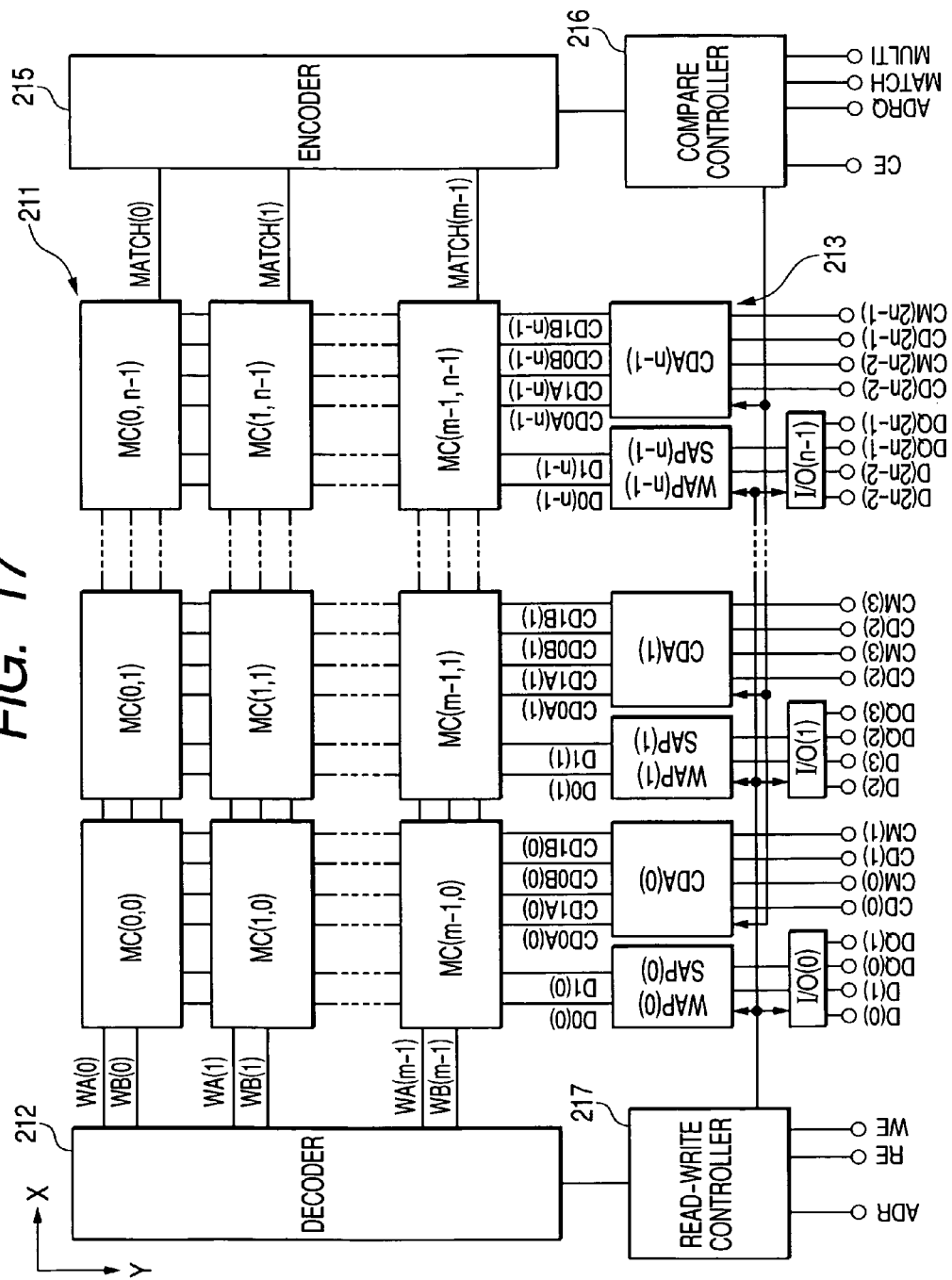
FIG. 17 is a block diagram showing an example of the structure of a CAM array including the memory cell illustrated in FIG. 9.

FIG. 17 shows an example of the structure of the CAM array 211 in which the memory cell of the binary type illustrated in FIG. 9 is arranged. In case of the memory cell of the binary type shown in FIG. 9, the number of comparison data lines is larger than that in the memory cell of the ternary type shown in FIG. 1. Therefore, the number of signal lines in the direct peripheral circuit 213 is larger than that in the case shown in FIG. 16.

Figure 19:
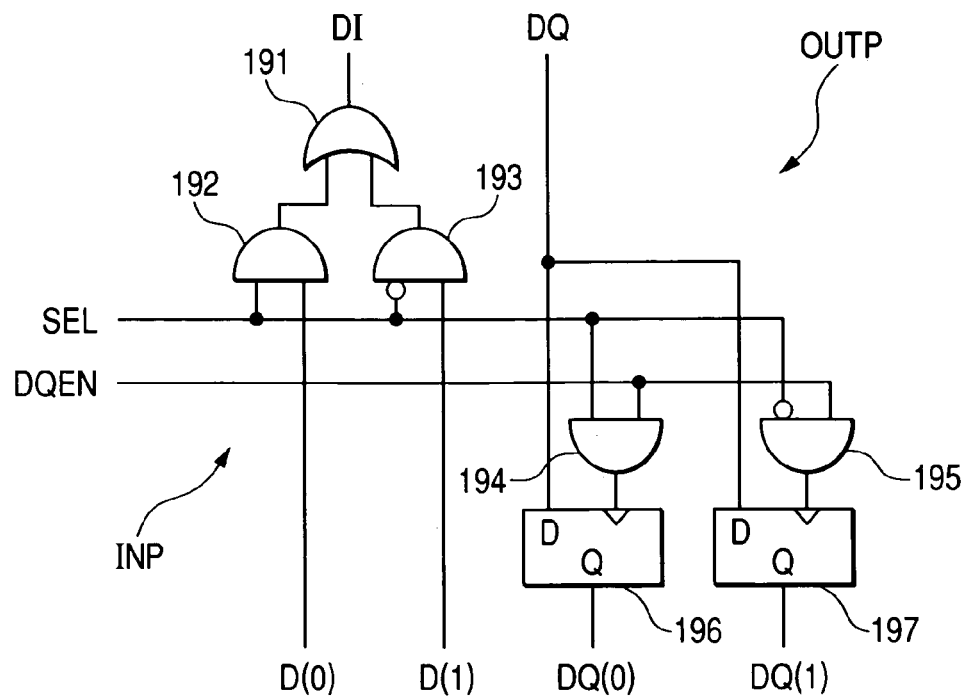
FIG. 19 is a circuit diagram showing an example of the structure of a main part in FIG. 17.

FIG. 19 shows an example of the structure of the input/output circuit I/O(0) in FIG. 17. Input/output circuits I/O(1) to I/O(n−1) have the same structures as the structure of the input/output circuit I/O(0).

The input/output circuit I/O(0) includes an input portion INP for fetching data to an inside and an output portion OUTP for outputting data to an outside. The input portion INP includes a 2-input AND gate 192 activated in response to a selecting signal SEL, a 2-input AND gate 193 activated in response to the logic inversion signal of the selecting signal SEL, and an OR gate 191 for obtaining the OR logic of the output signal of the AND gate 192 and the output signal of the AND gate 193. In the case in which the selecting signal SEL has a high level, input data D(0) are fetched through the AND gate 192. In the case in which the selecting signal SEL has a low level, input data DM(0) are fetched through the AND gate 193. Consequently, data D1 to be supplied to the write amplifier WAP(0) can be divided into D(0) and DM(0) based on age.

Moreover, the output portion OUTP includes an AND gate 194 for obtaining the AND logic of the selecting signal SEL and a data output enable signal DQEN, an AND gate 195 for obtaining the AND logic of the logic inversion signal of the selecting signal SEL and the data output enable signal DQEN, a latch circuit 196 capable of latching the data DQ output from the sense amplifier SAP(0) based on the output signal of the AND gate 194, and a latch circuit 197 capable of latching the data DQ output from the sense amplifier SAP(0) based on the output signal of the AND gate 195. In the case in which the selecting signal SEL has a high level, the output data DQ are output to an outside through the latch circuit 196 based on the output signal of the AND gate 194. In the case in which the selecting signal SEL has a low level, the output data DQ are output to an outside through the latch circuit 197 based on the output of the AND gate 195.

While the description has been given to the case in which the memory cell of the binary type is used, thus, it is possible to obtain the same functions and advantages as those in the memory cell of the ternary type also in this case.

While the invention made by the inventor has been specifically described above, the invention is not restricted thereto but it is apparent that various changes can be made without departing from the scope of the invention.

While the above description has been given to the case in which the invention made by the inventor is mainly applied to a CAM in an LSI for a router to be an applicability which is the background of the invention, the invention is not restricted thereto but can be widely applied to a system LSI integrated CAM to be used for information household appliances having a network connecting function, the cache memory of a microprocessor, or a pattern recognizing CAM or a data compressing CAM for a multimedia processing.

The invention can be applied on the condition that a memory cell is included.

The advantages obtained by the typical invention disclosed in the application will be briefly described as follows.

More specifically, it is possible to reduce the area of a memory cell in a CAM by enhancing a symmetry in the layout of a diffusion layer and a wiring layer in the memory cell. By utilizing a power wiring to carry out shielding, moreover, it is possible to reduce the noise of a match line or that of a data reading data line.

What is claimed is:

1. A semiconductor device having a memory unit comprising:
   a word line;
   a data line provided to cross the word line;
   a memory cell provided in a crossing portion of the word line and the data line;
   a comparison data line for fetching comparing data; and
   a match line for obtaining a result of a comparison of the comparing data transmitted through the comparison data line with data stored in the memory cell,
   wherein the memory cell includes a first storage portion, a second storage portion provided separately therefrom, and comparing means capable of comparing the comparing data transmitted through the comparison data line with data stored in the first storage portion and the second storage portion,
   wherein the data line is shared by the first storage portion and the second storage portion,
   wherein the comparison data line includes a first comparison data line and a second comparison data line,
   wherein the comparing means includes a first comparing circuit constituted by connecting a first transistor coupled to the first comparison data line and a second transistor coupled to a storage node of the first storage portion in series, and
   a second comparing circuit constituted by connecting a third transistor coupled to the second comparison data line and a fourth transistor coupled to a storage node of the second storage portion in series.

2. The semiconductor device according to claim 1, wherein the word line includes a first word line provided corresponding to the first storage portion and a second word line provided corresponding to the second storage portion.

3. The semiconductor device according to claim 1, wherein the memory cell includes a plurality of transistors which is provided with gate electrodes aligned in an identical direction to each other and is arranged to be line symmetrical about a direction of formation of a gate.

4. The semiconductor device according to claim 2, wherein a gate electrode of the second transistor and a gate electrode coupled to the second transistor in the first storage portion are shared, and
wherein a gate electrode of the fourth transistor and a gate electrode coupled to the fourth transistor in the second storage portion are shared.

5. The semiconductor device according to claim 1, wherein the first comparing circuit and the second comparing circuit are connected to the match line in common through a common contact hole.

6. A semiconductor device comprising:
   a memory unit including a word line;
   a data line provided to cross the word line;
   a memory cell provided in a crossing portion of the word line and the data line;
   a comparison data line for fetching comparing data; and
   a match line for obtaining a result of a comparison of the comparing data transmitted through the comparison data line with data stored in the memory cell,
   wherein the memory cell includes a first storage portion having a pair of storage nodes on a complementary level, a second storage portion provided separately therefrom and having a pair of storage nodes on the complementary level, and comparing means capable of comparing the comparing data transmitted through the comparison data line with data stored in the first storage portion and the second storage portion,
   wherein the data line includes a first data line provided on one of storage node sides in each of the first storage portion and the second storage portion and shared by one of the storage nodes in each of the first storage portion and the second storage portion, and a second data line provided on the other storage node side in each of the first storage portion and the second storage portion and shared by the other storage node in each of the first storage portion and the second storage portion,
   wherein the comparison data line has a first comparison data line and a second comparison data line,
   wherein the comparing means is constituted to include a first comparing circuit obtained by connecting a first transistor coupled to the first comparison data line and a second transistor coupled to the storage node on the first data line side in the first storage portion in series, and
   wherein a second comparing circuit obtained by connecting a third transistor coupled to the second comparison data line and a fourth transistor coupled to the storage node on the first data line side in the second storage portion in series.

7. The semiconductor device according to claim 6,
wherein the word line includes a first word line provided corresponding to the first storage portion and a second word line provided corresponding to the second storage portion.

8. The semiconductor device according to claim 7,
wherein the memory cell includes a plurality of transistors which is provided with gate electrodes aligned in an identical direction to each other and is arranged to be line symmetrical about a direction of formation of a gate.

9. The semiconductor device according to claim 8,
wherein a gate electrode of the second transistor and a gate electrode coupled to the second transistor in the first storage portion are shared, and
wherein a gate electrode of the fourth transistor and a gate electrode coupled to the fourth transistor in the second storage portion are shared.

10. The semiconductor device according to claim 9,
wherein the first comparing circuit and the second comparing circuit are connected to the match line in common through a common contact hole.

11. A semiconductor device comprising:
a memory unit including a word line;
a data line provided to cross the word line;
a memory cell provided in a crossing portion of the word line and the data line;
a comparison data line for fetching comparing data; and
a match line for obtaining a result of a comparison of the comparing data transmitted through the comparison data line with data stored in the memory cell,
wherein the memory cell includes a first storage portion having a pair of storage nodes on a complementary level, a second storage portion provided separately therefrom and having a pair of storage nodes on the complementary level, and comparing means capable of comparing the comparing data transmitted through the comparison data line with data stored in the first storage portion and the second storage portion,
wherein the data line is shared by the first storage portion and the second storage portion,
wherein the comparison data line includes a first comparison data line, a second comparison data line, a third comparison data line and a fourth comparison data line,
wherein the comparing means includes a first comparing circuit constituted by connecting a fifth transistor coupled to the first comparison data line and a sixth transistor coupled to one of the storage nodes in the first storage portion in series,
wherein a second comparing circuit constituted by connecting a seventh transistor coupled to the other storage node in the first storage portion and an eighth transistor coupled to the second comparison data line in series,
wherein a third comparing circuit constituted by connecting a ninth transistor coupled to the third comparison data line and a tenth transistor coupled to one of the storage nodes in the second storage portion in series, and
wherein a fourth comparing circuit constituted by connecting an eleventh transistor coupled to the other storage node in the second storage portion and a twelfth transistor coupled to the fourth comparison data line in series.

12. The semiconductor device according to claim 11,
wherein the word line includes a first word line provided corresponding to the first storage portion and a second word line provided corresponding to the second storage portion.

13. The semiconductor device according to claim 12,
wherein the memory cell includes a plurality of transistors which is provided with gate electrodes aligned in an identical direction to each other and is arranged to be line symmetrical about a direction of formation of a gate.

14. The semiconductor device according to claim 12,
wherein a gate electrode of the sixth transistor and a gate electrode coupled to the sixth transistor in the first storage portion are shared,
wherein a gate electrode of the seventh transistor and a gate electrode coupled to the seventh transistor in the first storage portion are shared,
wherein a gate electrode of the tenth transistor and a gate electrode coupled to the tenth transistor in the second storage portion are shared, and
wherein a gate electrode of the eleventh transistor and a gate electrode coupled to the eleventh transistor in the second storage portion are shared.

15. The semiconductor device according to claim 11,
wherein the first comparing circuit and the third comparing circuit are connected to the match line in common through a common contact hole, and the second comparing circuit and the fourth comparing circuit are connected to the match line in common through a common contact hole.

16. The semiconductor device according to claim 11,
wherein the first storage portion and the second storage portion include first and second p-channel type MOS transistors and first, second, third and fourth n-channel type MOS transistors respectively, the first and second p-channel type MOS transistors are formed in an n well region provided between a first p well region in which the first and second n-channel type MOS transistors are to be formed and a second p well region in which the third and fourth n-channel type MOS transistors are to be formed, and the first, second, third and fourth comparing circuits are formed in the first p well region.

17. The semiconductor device according to claim 14,
wherein the memory cell is arranged to be line symmetrical with respect to a center line passing through a central point of the memory cell in a direction of extension of the gate electrode.

18. The semiconductor device according to claim 15,
wherein the data line and the comparison data line are formed by the same wiring layer and a power wiring is provided between the data line and the comparison data line.

19. The semiconductor device according to claim 16,
wherein the first storage portion and the second storage portion are provided to be line symmetrical about an axis which is parallel with a direction of extension of the word line.

* * * * *